US007604923B2

(12) United States Patent
Goto

(10) Patent No.: US 7,604,923 B2
(45) Date of Patent: Oct. 20, 2009

(54) IMAGE FORMING METHOD

(75) Inventor: Takahiro Goto, Shizuoka-ken (JP)

(73) Assignee: FUJIFILM Corporation, Tokyo (JP)

(*) Notice: Subject to any disclaimer, the term of this patent is extended or adjusted under 35 U.S.C. 154(b) by 352 days.

(21) Appl. No.: 10/756,679

(22) Filed: Jan. 14, 2004

(65) Prior Publication Data

US 2004/0223042 A1 Nov. 11, 2004

(30) Foreign Application Priority Data

Jan. 14, 2003 (JP) ............................ 2003-005522

(51) Int. Cl.
*G03F 7/30* (2006.01)
*B41C 1/10* (2006.01)

(52) U.S. Cl. .................... 430/302; 430/271.1; 430/944; 101/465; 101/466; 101/467

(58) Field of Classification Search .............. 430/271.1, 430/302; 101/465, 466, 467
See application file for complete search history.

(56) References Cited

U.S. PATENT DOCUMENTS

| | | | | |
|---|---|---|---|---|
| 3,725,356 | A | 4/1973 | Lüders et al. | |
| 3,804,631 | A | 4/1974 | Faust | |
| 3,839,171 | A | 10/1974 | Akamatsu et al. | |
| 3,930,865 | A | 1/1976 | Faust et al. | |
| 4,019,972 | A | 4/1977 | Faust | |
| 4,153,799 | A | 5/1979 | Gilman et al. | |
| 4,239,849 | A | 12/1980 | Lipson et al. | |
| 4,476,215 | A | 10/1984 | Kausch | |
| 4,499,163 | A | 2/1985 | Ishimaru et al. | |
| 4,510,227 | A | 4/1985 | Mohr et al. | |
| 4,537,855 | A | 8/1985 | Ide | |
| 4,687,727 | A | 8/1987 | Toyama et al. | |
| 4,772,538 | A | 9/1988 | Walls et al. | |
| 4,950,581 | A | 8/1990 | Koike et al. | |
| 4,952,478 | A | 8/1990 | Miyagawa et al. | |
| 5,080,999 | A | 1/1992 | Imai et al. | |
| 5,200,292 | A | 4/1993 | Shinozaki et al. | |
| 5,246,816 | A | 9/1993 | Yamasita et al. | |
| 5,340,699 | A | 8/1994 | Haley et al. | |
| 5,496,768 | A * | 3/1996 | Kudo | 438/487 |
| 5,641,608 | A | 6/1997 | Grunwald et al. | |
| 5,705,322 | A | 1/1998 | West et al. | |
| 5,919,601 | A | 7/1999 | Nguyen et al. | |
| 5,952,154 | A | 9/1999 | Barr et al. | |
| 5,965,319 | A | 10/1999 | Kobayashi | |
| 6,013,412 | A | 1/2000 | Aoshima | |
| 6,030,750 | A | 2/2000 | Vermeersch et al. | |
| 6,309,792 | B1 | 10/2001 | Hauck et al. | |
| 6,399,689 | B1 | 6/2002 | Scarlette | |
| 6,423,462 | B1 | 7/2002 | Kunita | |
| 6,482,571 | B1 | 11/2002 | Teng | |
| 6,566,035 | B1 | 5/2003 | Aoshima | |
| 6,576,401 | B2 | 6/2003 | Teng | |
| 6,720,125 | B2 * | 4/2004 | Nakamura et al. | 430/157 |
| 6,733,948 | B2 | 5/2004 | Nakamura et al. | |
| 6,740,470 | B2 * | 5/2004 | Tan et al. | 430/271.1 |
| 6,780,562 | B2 * | 8/2004 | Sorori et al. | 430/270.1 |
| 6,794,116 | B2 | 9/2004 | Oshima | |
| 6,838,222 | B2 | 1/2005 | Aoshima et al. | |
| 6,861,200 | B2 | 3/2005 | Oshima | |
| 7,032,514 | B2 * | 4/2006 | Mori et al. | 101/463.1 |
| 2001/0036598 | A1 * | 11/2001 | Shimada et al. | 430/281.1 |
| 2002/0051934 | A1 | 5/2002 | Nakamura et al. | |
| 2002/0055058 | A1 | 5/2002 | Sorori et al. | |
| 2002/0136987 | A1 | 9/2002 | Oshima | |
| 2002/0160295 | A1 | 10/2002 | Aoshima et al. | |
| 2002/0177074 | A1 | 11/2002 | Hoshi et al. | |
| 2002/0182539 | A1 | 12/2002 | Fujimaki et al. | |
| 2002/0197564 | A1 | 12/2002 | Timpe et al. | |
| 2003/0008239 | A1 | 1/2003 | Fujimaki et al. | |
| 2003/0068575 | A1 | 4/2003 | Yanaka | |
| 2003/0073032 | A1 | 4/2003 | Aoshima | |
| 2003/0082478 | A1 | 5/2003 | Itakura et al. | |
| 2003/0146965 | A1 | 8/2003 | Fujimaki et al. | |
| 2003/0162127 | A1 | 8/2003 | Kikuchi | |
| 2003/0186174 | A1 | 10/2003 | Nagase | |
| 2004/0063034 | A1 | 4/2004 | Goto | |
| 2004/0068026 | A1 | 4/2004 | Kunita et al. | |
| 2004/0072101 | A1 | 4/2004 | Sugasaki et al. | |
| 2004/0131971 | A1 | 7/2004 | Sugasaki et al. | |
| 2004/0137369 | A1 | 7/2004 | Shimada | |
| 2004/0170920 | A1 | 9/2004 | Gota | |
| 2004/0170922 | A1 | 9/2004 | Goto | |
| 2004/0175648 | A1 | 9/2004 | Goto | |
| 2004/0202957 | A1 | 10/2004 | Murota | |
| 2004/0234893 | A9 | 11/2004 | Fujimaki | |

(Continued)

FOREIGN PATENT DOCUMENTS

CA 1338095 2/1996

(Continued)

OTHER PUBLICATIONS

McGinniss, Vincent D., "Radiation Curing: 6. Curing with Ultraviolet, Visible and Infrared Processing Equipment" from Kirk-Othmer Encyclopedia of Chemical Technology, copyright 1996, by John Wiley & Sons, Inc., Article Online posting date Dec. 4, 2000.

(Continued)

*Primary Examiner*—John S Chu
(74) *Attorney, Agent, or Firm*—Sughrue Mion, PLLC

(57) ABSTRACT

The present invention provides an image forming method comprising the steps of exposing imagewisely an image forming material having a photosensitive layer comprising an infrared absorbing agent, a polymerization initiator and a polymerizable compound on a substrate to overlapping infrared beams. The solubility of the photosensitive layer in an alkali developing solution reduces upon exposure to light of wavelengths in the range of 750 nm to 1400 nm. The exposed image forming material is developed, and the infrared beam diameter used in light exposure is 20 μm or less, and the overlapping coefficient is 0.8 or more.

16 Claims, 4 Drawing Sheets

U.S. PATENT DOCUMENTS

| | | | |
|---|---|---|---|
| 2004/0244619 | A1 | 12/2004 | Goto |
| 2005/0026082 | A1 | 2/2005 | Shimada |
| 2005/0037282 | A1 | 2/2005 | Sonokawa |

FOREIGN PATENT DOCUMENTS

| | | | |
|---|---|---|---|
| EP | 0 377 321 | A2 | 7/1990 |
| EP | 0 684 522 | A1 | 11/1995 |
| EP | 0 779 161 | A1 | 6/1997 |
| EP | 0 919 870 | A1 | 6/1999 |
| EP | 0 950 517 | A1 | 10/1999 |
| EP | 0 950 518 | A1 | 10/1999 |
| EP | 1 033 624 | A1 | 9/2000 |
| EP | 1 096 315 | A1 | 5/2001 |
| EP | 1 110 747 | A1 | 6/2001 |
| EP | 1 160 095 | A2 | 12/2001 |
| EP | 1 176 467 | A1 | 1/2002 |
| EP | 1 182 033 | A1 | 2/2002 |
| EP | 1 186 407 | A1 | 3/2002 |
| EP | 1 216 830 | A2 | 6/2002 |
| EP | 1 219 464 | A2 | 7/2002 |
| EP | 1 235 107 | A1 | 8/2002 |
| EP | 1 241 002 | A2 | 9/2002 |
| EP | 1 245 405 | A2 | 10/2002 |
| EP | 1 249 343 | A2 | 10/2002 |
| EP | 1 249 731 | A2 | 10/2002 |
| EP | 1 332 870 | A2 | 8/2003 |
| EP | 1 338 921 | A2 | 8/2003 |
| EP | 1 341 040 | A1 | 9/2003 |
| EP | 1 369 231 | A2 | 12/2003 |
| EP | 1 400 851 | A2 | 3/2004 |
| EP | 1 449 650 | A2 | 8/2004 |
| EP | 1 450 207 | A1 | 8/2004 |
| GB | 1 521 372 | | 8/1978 |
| JP | 54-92723 | A | 7/1979 |
| JP | 54-25957 | B2 | 8/1979 |
| JP | 54-34327 | B2 | 10/1979 |
| JP | 58-29803 | A | 2/1983 |
| JP | 58-12577 | B2 | 3/1983 |
| JP | 58-134629 | A | 8/1983 |
| JP | 59-44615 | A | 3/1984 |
| JP | 59-71048 | A | 4/1984 |
| JP | 2-161442 | A | 6/1990 |
| JP | 4-31863 | A | 2/1992 |
| JP | 4-106548 | A | 4/1992 |
| JP | 7-20629 | A | 1/1995 |
| JP | 7-271029 | A | 10/1995 |
| JP | 8-108621 | A | 4/1996 |
| JP | 9-43847 | A | 2/1997 |
| JP | 9-134011 | A | 5/1997 |
| JP | 2712564 | B2 | 10/1997 |
| JP | 10-195119 | A | 7/1998 |
| JP | 10-324061 | A | 12/1998 |
| JP | 11-258801 | A | 9/1999 |
| JP | 2000-131837 | A | 5/2000 |
| JP | 2000-267265 | A | 9/2000 |
| JP | 2000-321780 | A | 11/2000 |
| JP | 2001-133969 | A | 5/2001 |
| JP | 2001-277464 | A | 10/2001 |
| JP | 2002-40652 | A | 2/2002 |
| JP | 2002-72462 | | 3/2002 |
| JP | 2002-268217 | A | 9/2002 |
| WO | WO 00/48836 | A1 | 8/2000 |

OTHER PUBLICATIONS

SR-295, product bulletin, Sartomer Company, Exton, PA, one page, dated Nov. 1998 from internet through Sartomer web site.
SR-399, Product bulletin, Sartomer Company, Exton, PA., one page, dated Nov. 1998, from internet through Sartomer web site.
SR-492, product bulletin, Sartomer Company, Exton, PA on page, dated Nov. 1998 from internet through Sartomer web site.
CD-501, product bulletin, Sartomer Company, Exton, PA, one page, dated May 1999 from internet through Sartomer web site.
SR-368, product bulletin, Sartomer Company, Exton, PA 1 pate, dated Nov. 1998, from internet through Sartomer web site.
Product Data, Scripset 550 Styreen Maleic Anhydride Copolymer Solid, Hercules Incorporated, copyright 1999, dated Jun. 2000 from internet.
European Search Report dated Jul. 2, 2002.
European Search Report dated Apr. 16, 2004.
European Search Report dated Jan. 16, 2004.
European Search Report dated Jun. 14, 2005.
Jerry March: "Advanced organic chemistry: reactions, mechanisms, and structure" 1992, Wiley-Interscient, $4^{th}$ Ed., USA, XP 002275533 p. 280, Table 9.4.
Ben-zyl from The American Heritage dictionary of the English Language, Fourth Edition, copyright 2000 by Houghton Mifflin Company found at yourdictionary.com, one page.
Mineo et al, 08062834, English Abstract of Japanese Published Application 08062834 dated Mar. 8, 1996, p. Patent Abstracts of Japan dated 1996.
Office Action dated Jan. 31, 2005 from U.S. Appl. No. 10/673,332.
Office Action dated Jan. 25, 2005 from U.S. Appl. No. 10/673,332.
Office Action dated Apr. 18, 2005 from U.S. Appl. No. 10/781,922.
Office Action dated Mar. 9, 2005 from U.S. Appl. No. 10/671,776.
Office Action dated Feb. 23, 2005 from U.S. Appl. No. 10/669,696.
Office Action dated Apr. 18, 2005 from U.S. Appl. No. 10/781,645.
Registry No. 2154-56-5, one page, "benzyl".
Patent Abstracts of Japan for Publication No. 0806283. Published Mar. 8, 1994.
Patent Abstracts of Japan for Publication No. 59-053836, Published Mar. 28, 1984, Applicant: Fuji Photo Film Co., Ltd.
Office Action dated Aug. 1, 2005, for U.S. Appl. No. 10/669,696.

* cited by examiner

IMAGE FORMING METHOD

CROSS-REFERENCE TO RELATED APPLICATION

This application claims priority under 35 USC 119 from Japanese Patent Application No. 2003-5522, the disclosure of which is incorporated by reference herein.

BACKGROUND OF THE INVENTION

1. Field of the Invention

The present invention relates to a method of forming an image on an image forming material, and in particular, to an image forming method useful for a planographic printing plate precursor capable of direct plate-making by scanning a printing plate precursor using an infrared laser beam based on digital signals from a device such as a computer.

2. Description of the Related Art

The development of laser technology in recent years has been remarkable, and a small high-power laser element can be easily obtained as a solid laser element or a semiconductor laser element that emits infrared rays of wavelengths of, in particular, 760 to 1200 nm (hereinafter also referred to as "infrared laser"). These infrared lasers are very useful as recording light sources for direct plate-making from digital data outputted from devices such as computers. Accordingly, there is an increasing need in recent years for an image recording material highly sensitive to light emitted from such infrared recording light sources, that is, an image recording material having a layer whose solubility in a developing solution significantly changes due to factors such as photochemical reactions arising from infrared laser beam irradiation.

Image recording materials capable of recording with such infrared lasers include those comprising an onium salt, resol resin, novolak resin and an infrared absorbing agent (see, for example, Japanese Patent Application Laid-Open (JP-A) No. 7-20629); and an image forming material comprising haloalkyl-substituted s-triazine, resol resin, novolak resin and an infrared absorbing agent (see, for example, JP-A No. 7-271029).

Meanwhile, methods of exposing these image recording materials to light include a light exposure method intended to improve productivity by shortening the time necessary for light exposure, for example, a method of exposure to light at low resolution. Specifically, a method of exposure to light at a resolution of 1300 dpi or less is used in the field of newspaper printing.

However, the image-forming ability of image recording materials obtained by exposure to light at low resolution is inferior to the image-forming ability of materials obtained by exposure to high-resolution light of 2000 dpi or more, and for example, when the technology is applied to a method of making a printing plate from a planographic printing plate precursor, there is a problem in that the printing durability of the resulting planographic printing plate deteriorates when printing.

Image forming materials having a negative type polymerizable photosensitive layer, to which the method of the present invention is applied, may result in a lowering of polymerizability due to the influences of, particularly, oxygen or moisture in the air, and from this viewpoint, there is a demand for an image forming method capable of achieving a rapid and reliable curing reaction.

SUMMARY OF THE INVENTION

To solve the problem described above, an object of the present invention is to provide an image forming method capable of high-speed light exposure and having excellent image-forming ability with improvements in humidity dependence at the time of light exposure. Particularly, the present invention provides an image forming method useful for a plate-making process utilizing a plate from a planographic printing plate precursor, excelling both in terms of productivity and printing durability.

To solve the problem described above, the present inventors made extensive study on various methods, and as a result, found that the aforementioned object can be achieved by solving said problem, thereby completing the invention.

That is, a first aspect of the image forming method of the invention comprises imagewisely exposing an image forming material to overlapping infrared beams, the image forming material having, on a substrate, a photosensitive layer comprising an infrared absorbing agent, a polymerization initiator and a polymerizable compound and exhibiting a reduction in solubility in an alkali developing solution upon exposure to light of wavelengths of 750 nm to 1400 nm. The image forming material is developed via imagewise light exposure carried out under conditions where the infrared beam diameter used in the light exposure step is 20 μm or less, and an overlapping coefficient, which is the ratio of the full-width half-maximum (FWHM) of the infrared beam diameter to the distance between beam centers in the sub-scanning direction, is 0.8 or more.

A second aspect of the invention is to provide an image forming method comprising imagewisely exposing an image forming material to overlapping infrared beams emitted from a laser diode light source, the image forming material having, on a substrate, a photosensitive layer comprising an infrared absorbing agent, a polymerization initiator and a polymerizable compound and exhibiting a reduction in solubility in an alkali developing solution upon exposure to light of wavelengths of 750 nm to 1400 nm. The image forming material is developed by imagewise light exposure carried out under conditions where the resolution of the infrared beam used in the light exposure step is from at least 300 to at most 1300 dpi, the beam diameter is 20 μm or less, and the overlapping coefficient is 0.8 or more.

The polymerizable negative type photosensitive layer of the image forming material used herein has a mechanism wherein the polymerization initiator is decomposed with heat or light to generate radicals to cure the polymerizable compound via a polymerization reaction so as to form an image. This polymerizable negative type photosensitive layer having the above-described image forming mechanism is characterized by the short life span of the generated radicals, and by the application of high energy to the photosensitive layer in a short time period, thereby achieving a good curing reaction, however, when the output power of the infrared laser used in light exposure is too high, the photosensitive layer may undergo ablation. On the other hand, when the photosensitive layer is exposed to light for a long time with a low-power laser, there is a problem with a reduction in productivity in the plate making process. The image forming method of the present invention is particularly useful for such image forming materials.

The image forming method of the present invention is applied particularly preferably to an image forming material provided successively with, on a substrate, a photosensitive layer and a protective layer. The phrase "provided successively with" means that a photosensitive layer and a protective layer are formed in this order on a substrate, however, other optional layers such as an undercoat layer and a back coat layer may be arranged as necessary.

The image forming method of the invention is particularly useful in application to an image forming material provided with a photosensitive layer comprising an infrared absorbing agent, a polymerization initiator, a polymerizable compound and a binder polymer having a repeating unit represented by the following formula (I):

(I)

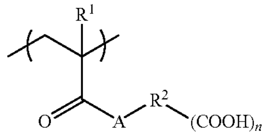

In formula (I), $R^1$ represents a hydrogen atom or a methyl group; $R^2$ represents a linking group composed of two or more atoms selected from the group consisting of a carbon atom, a hydrogen atom, an oxygen atom, a nitrogen atom and a sulfur atom wherein the number of atoms is 2 to 82; A represents an oxygen atom or —$NR^3$—, wherein $R^3$ represents a hydrogen atom or a monovalent hydrocarbon group having 1 to 10 carbon atoms; and n is an integer of 1 to 5.

In one embodiment of the invention, the binder polymer having a repeating unit represented by formula (I) and contained in the photosensitive layer, has excellent diffusibility in a developing solution and solubility in an aqueous alkali solution. Due to this excellent solubility in a developing solution, the binder polymer can prevent the photosensitive layer from being damaged by penetration of developing solution attributed to the content of acid groups, even in a very small content of the acid groups, and is hardly affected by moisture in the atmosphere, thus preventing deterioration of the image-forming property due to moisture.

The image forming material used in one embodiment of the invention is a photosensitive planographic printing plate.

The protective layer of the image forming material, used in one embodiment of the invention, comprises at least one water-soluble polymer selected from the group consisting of polyvinyl alcohols, vinyl alcohol/vinyl phthalate copolymers, vinyl acetate/vinyl alcohol/vinyl phthalate copolymers, vinyl acetate/crotonic acid copolymers, polyvinyl pyrrolidone, acidic celluloses, gelatin, gum arabic, polyacrylic acid and polyacrylamide, and the oxygen permeability of the protective layer at 25° C. at 1 atmosphere of pressure is $0.2 \leqq A \leqq 20$ (cc/$m^2$·day).

The overlapping coefficient in imagewise light exposure in one embodiment of the invention is in the range of 0.8 to 4.

In one embodiment of the invention, the image forming method further comprises a heating step for heat treatment of the light-exposed photosensitive planographic printing plate at a temperature in the range of 60 to 150° C. after the step of light exposure with an infrared beam and before the image forming step of developing the photosensitive planographic printing plate.

In one embodiment of the invention, the image forming method further comprises a step of desensitizing the photosensitive planographic printing plate with a desensitizing solution after the image forming step of developing the photosensitive planographic printing plate.

DETAILED DESCRIPTION OF THE INVENTION

Figure 1:
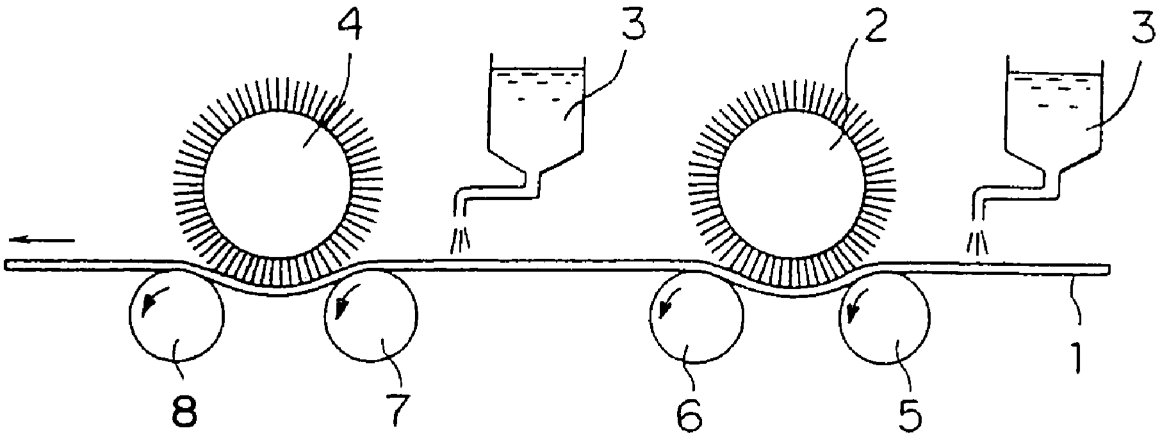
FIG. 1 is a side view showing the concept of a brush graining step used in mechanical surface roughening treatment in preparation of the planographic printing substrate in the present invention.

Hereinafter, the present invention is described in more detail. The image forming method using a planographic printing plate precursor for the image forming material and the method of making a planographic printing plate precursor will be described, but the invention is not particularly limited thereto.

The light exposure device used in imagewise light exposure in the invention is not particularly limited insofar as an infrared beam diameter of 20 μm or less can be achieved, however, it is preferable to use a light exposure device whose light source is a laser diode (LD) emitting infrared rays. It is particularly preferable to use a semiconductor laser as the light source. The resolution of light exposure is preferably 1300 dpi or less, from the viewpoint of achieving good productivity. The lower limit of the light exposure resolution is not particularly limited, however, it has been set at about 300 dpi from the viewpoint of effect.

The light exposure method in the invention can be carried out by overlapping beams from a light source. The term "overlapping" means that the distance between beam centers in the sub-scanning direction is smaller than the beam diameter. For example, when the beam diameter is expressed in terms of FWHM, the overlapping can be quantitatively expressed as FWHM/distance between beam centers in the sub-scanning direction (i.e., overlapping coefficient).

In the invention, the overlapping coefficient must be 0.8 or more, more preferably 1 or more by which half of the beam diameter is overlapped. In order to improve productivity, a smaller overlapping coefficient is preferred, and from the viewpoint of improvement of the image-forming ability, a higher overlapping coefficient is preferred.

When the overlapping coefficient is less than 0.8, the image-forming property may be insufficient. That is, image density in the overlapped region is lowered by deteriorated printing durability. The upper limit of the overlapping coefficient is not particularly limited, but when the overlapping coefficient is higher than 4, an ablation may occur, resulting in deterioration of printing durability.

In the invention, the overlapping coefficient at the time of light exposure is in the range described above, whereby excellent image-forming property can be exhibited even if light-exposure is carried out at a low resolution of 1300 dpi or less, and a planographic printing plate precursor is exposed to light. A strong image can be formed without being influenced by environmental humidity, thereby realizing high printing durability.

The invention can be used preferably as an image forming method for printing in fields such as newspapers, which places importance on productivity.

The scanning system using a light source in the light exposure device of the present invention is not particularly limited, and known scanning methods such as a drumouter surface scanning method, a drum inner surface scanning method or a flatbed scanning method can be used. The channel of the light source may be single or multi-channel, but in the case of the drum outer surface scanning method, a multi-channel is preferably used.

In the invention, development treatment may be carried out immediately after light-exposure, however, it is preferable that the development treatment is carried out after heat treatment, that is, that heat treatment is carried out between the light exposure step and the development step. This heat treatment is carried out preferably for between 5 seconds to 5 minutes at a temperature in the range of 600 to 150° C.

The heat treatment can be carried out by a method selected from various known methods in the art. Examples of such methods include a heating a planographic printing plate precursor functioning as the image forming material by bringing the printing plate precursor into contact with a panel heater or a ceramic heater, and, in a non-contact system, heating the printing plate precursor with a lamp or hot air. By subjecting the printing plate precursor to such heat treatment, the amount of laser energy necessary for recording an image can be reduced.

The development processing is not particularly limited, but usually water or an aqueous alkaline solution are used as the developing solution. The developing solution and its replenishing solution used for this kind of development processing can be selected from aqueous alkali solutions known in the art. Examples include inorganic alkali salts such as sodium silicate, potassium silicate, tri-sodium phosphate, tri-potassium phosphate, tri-ammonium phosphate, di-sodium hydrogen phosphate, di-potassium hydrogen phosphate, di-ammonium hydrogen phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide; and organic alkalis such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, and pyridine. An inorganic alkali salt and an organic alkali are used either singly or in combination thereof.

The developing solution using an inorganic alkali salt or an organic alkali includes, for example, aqueous solutions of silicates such as sodium silicate and potassium silicate, such as those alkali metal silicates described in JP-A No. 54-62004 and Japanese Patent Application Publication (JP-B) No. 57-7427. Developability can be regulated easily by regulating the mixing ratio and concentration of silicon oxide $SiO_2$ and an alkali metal oxide $M_2O$ (M is an alkali metal) as silicate components.

In the industrial fields of plate-making and printing, automatic developing machines for plate-making have come to be widely used in recent years in order to standardize plate-making operations. These automatic developing machines generally comprise a developing section, a post-processing section, a device for transporting a printing plate precursor, processing solution tanks and spraying devices, and while an exposed printing plate is transported horizontally, each processing solution drawn by a pump is sprayed onto the printing plate through a spray nozzle. A recent method of dip-processing a printing plate precursor in a treating solution tank filled with a processing solution while transporting the printing plate precursor via guide rolls in the solution is also known. Such automatic processing can be carried out in each processing solution while being replenished with replenishing solutions in accordance with factors such as operation time.

In this case, an aqueous solution having a higher alkali strength than that of the developing solution is added as a replenishing solution to the developing solution, whereby a large number of planographic printing plate precursors can be processed without replacing the developing solution in a development tank for a prolonged period of time. In a preferable embodiment of the invention, this replenishing system can be used.

For promoting and suppressing developing performance, for dispersing development scum and for enhancing the affinity of the image area on the printing plate for ink, various surfactants and organic solvents can be added as necessary to the developing solution and the replenishing solution. The surfactant is preferably an anionic, cationic, nonionic or amphoteric surfactant, and the organic solvent is preferably benzyl alcohol or the like. Addition of polyethylene glycol or derivatives thereof or polypropylene glycol or derivatives thereof is also preferable.

If necessary, hydroquinone, resorcin, inorganic salt-based reducing agents such as sodium or potassium salt of sulfite or hydrogen sulfite, organic carboxylic acids, defoaming agents and hard water-softening agents can also be added.

The developing solution containing a surfactant, an organic solvent and a reducing agent includes, for example, the developer composition comprising benzyl alcohol, an anionic surfactant, an alkali, and water, as described in JP-A No. 51-77401; the developer composition comprising an aqueous solution containing benzyl alcohol, an anionic surfactant, and a water-soluble sulfite, as described in JP-A No. 53-44202; and the developer composition comprising an organic solvent having a water solubility of 10% by mass or less at room temperature, an alkali, and water, as described in JP-A No. 55-155355. It is preferable to use these compositions in the invention.

The planographic printing plate subjected to development processing with the aforementioned developing solution and replenishing solution is post-processed with washing water, a rinse solution containing a surfactant, and a desensitizing solution containing gum arabic or starch derivatives. These processing solutions can be used in combination.

The so-called "disposable" processing system for processing with a substantially virgin processing solution can also be applied.

The planographic printing plate thus obtained is coated with a desensitizing gum as necessary and then subjected to printing. The plate can also be subjected to burning treatment in order to further improve printing durability. When the planographic printing plate is subjected to burning treatment, the plate prior to burning is preferably treated with an affinitizing solution, such as those described in JP-B Nos. 61-2518, 55-28062, and JP-A Nos. 62-31859 and 61-159655. This treatment can be carried out by applying a sponge or adsorbent cotton infused or soaked with the affinitizing solution onto the planographic printing plate, by dipping the printing plate in a bath filled with the affinitizing solution, or by coating with an automatic coater. Preferably, the affinitizing solution is uniformly applied with a squeezer or squeeze rollers. Generally, the amount of affinitizing solution applied is preferably 0.03 to 0.8 g/$m^2$ (dry weight).

The planographic printing plate coated with the affinitizing solution is dried and then heated at high temperatures with a burning processor (e.g., BP-1300 available from Fuji Photo Film Co., Ltd.) as necessary. The heating temperature and time are varied depending on the type of components forming the image, but are preferably 180° to 300° C. at 1 to 20 minutes.

After burning treatment, the planographic printing plate can be subjected to conventional treatments such as washing with water and gumming as necessary. When an affinitizing solution containing compounds such as water-soluble polymers is used, so-called desensitizing treatments such as gumming can be omitted. The planographic printing plate obtained by this treatment is loaded onto a device such as an offset printing machine and used for printing on a large number of papers.

Hereinafter, the planographic printing plate precursor as an image forming material to which the method of the invention is applied will be described in more detail.

The planographic printing plate precursor preferably used in the invention is provided with a photosensitive layer comprising an infrared absorbing agent (A), a polymerization initiator (B) and a polymerizable compound (C), the photosensitive layer exhibiting a reduction in solubility in an alkali developing solution upon exposure to light of wavelengths of 750 nm to 1400 nm. In a preferable embodiment, this image forming material has a protective layer on the photosensitive layer, and the photosensitive layer preferably comprises a binder polymer having a repeating unit represented by formula (I) below in addition to the components described above.

(I)

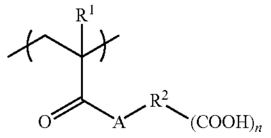

The photosensitive layer of the planographic printing plate precursor in the invention is an infrared ray-sensitive negative-type image recording material, and the image forming process of this planographic printing plate precursor is generally explained below.

The image forming process involves irradiation with an infrared laser beam, wherein the laser light is absorbed efficiently by the infrared absorbing agent (A) present in the irradiated region, and the light-exposed region only generates heat by the accumulated absorbed energy, thereby decomposing the polymerization initiator (B) to generate radicals. By the generated radicals, the coexisting polymerizable compound (C) undergoes a polymerization reaction, and only the light-exposed area becomes insoluble in an aqueous alkali, to form an image, while the region not exposed to light is removed by alkali development, so as to form the desired image. By regulating the overlapping efficient in a predetermined range in this light exposure step, excellent productivity and printing durability can be achieved.

Hereinafter, the constitution of the image forming layer in the planographic printing plate precursor of the present invention will be described in more detail.

[(A) Infrared Absorbing Agent]

The infrared absorbing agent (A) in the invention functions to convert absorbed infrared rays into heat, and with this generated heat, a polymerization initiator (B) (described later) is decomposed to generate radical acids. The infrared absorbing agent preferably used in the invention is a dye or pigment capable of effectively absorbing infrared rays having wavelengths of 750 to 1,400 nm, and more preferably, a dye or pigment having a maximum absorption at a wavelength in the range of 750 to 1,400 nm.

The dye may be any known commercial dye including those described in publications such as *Senryo Binran* (Dye Handbook) (published in 1970 and compiled by the Society of Synthetic Organic Chemistry, Japan). Examples of such dyes include azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium dyes, pyrylium salts, and metal thiolate complexes. Preferable dyes include cyanine dyes such as those described in patent documents such as JP-A Nos. 58-125246, 59-84356, 59-202829, and 60-78787, and the methine dyes described in JP-A Nos. 58-173696, 58-181690, 58-194595, etc. Further, the naphthoquinone dyes described in JP-A Nos. 58-112793, 58-224793, 59-48187, 59-73996, 60-52940, 60-63744, etc., the squarylium dyes described in JP-A No. 58-112792, etc., and thecyanine dyes described in British Patent No.434,875 are also preferably used.

The near infrared ray-absorbing sensitizers described in U.S. Pat. No. 5,156,938 are also preferably used. Also preferably used are the substituted aryl benzo(thio) pyrylium salts described in U.S. Pat. No. 3,881,924; the trimethine thiapyrylium salts described in JP-A No. 57-142645 (U.S. Pat. No. 4,327,169); the pyrylium type compounds described in JP-A Nos. 58-181051, 58-220143, 59-41363, 59-84248, 59-84249, 59-146063, and 59-146061; the cyanine dyes described in JP-A No. 59-216146; the pentamethine thiopyrylium salts described in U.S. Pat. No. 4,283,475; and the pyrylium compounds described in JP-B Nos. 5-13514 and 5-19702. Other preferable examples of dyes include the near infrared ray-absorbing dyes of formulae (I) and (II) described in U.S. Pat. No. 4,756,993. Particularly preferable among these dyes are cyanine dyes, squarylium dyes, pyrylium salts and nickel/thiolate complexes.

The pigment includes commercial pigments and those described in the Color Index (C. I.) Handbook, *Saishin Ganryo Binran* (Latest Dye Handbook) (published in 1977 and compiled by the Japanese Society of Pigment Technology); *Saishin Ganryho Oyo Gijyutsu* (Latest Pigment Applied Technology) (published in 1986 by CMC Publishing Co., Ltd.); and *Insatsu Inki Gijyutsu* (Printing Ink Technology) (published in 1984 by CMC Publishing Co., Ltd.). Examples include black pigments, yellow pigments, orange pigments, brown pigments, red pigments, violet pigments, blue pigments, green pigments, fluorescent pigments, metallic powder pigments, and other pigments such as polymer-binding dyes.

Specific examples of preferable pigments include insoluble azo pigments, azo lake pigments, condensed azo pigments, chelate azo pigments, phthalocyanine type pigments, anthraquinone type pigments, perylene and perinone type pigments, thioindigo type pigments, quinacridone type pigments, dioxazine type pigments, isoindolinone type pigments, quinophthalone type pigments, dyed lake pigments, azine pigments, nitroso pigments, nitro pigments, natural pigments, fluorescent pigments, inorganic pigments, and carbon black, which is preferable among these.

The pigments may or may not be subjected to surface treatment. Methods of surface treatment include coating the surface with resin or wax; allowing a surfactant to adhere to the surface; and bonding a reactive material (e.g., a silane coupling agent, an epoxy compound, a polyisocyanate, etc.) onto the surface of the pigment. These methods of surface treatment are described in *Kinzoku Sekken No Seishitsu To Oyo* (Properties and Application of Metallic Soap) (Sachi Shobo); *Insatsu Inki Gijyutsu* (Printing Ink Technology) (published in 1984 by CMC Publishing Co., Ltd.); and *Saishin Ganryho Oyo Gijyutsu* (Latest Pigment Applied Technology) (published in 1986 by CMC Publishing Co., Ltd.).

The particle diameters of the pigments are in the range of preferably 0.01 to 10 μm, more preferably 0.05 to 1 μm, and most preferably 0.1 to 1 μm. A pigment particle diameter of less than 0.01 μm is not preferable, since the stability of the pigment dispersion for a coating solution for the photosensitive layer (image forming layer) may deteriorate, whereas a particle diameter of more than 10 μm is not preferable since the uniformity of the photosensitive layer may deteriorate.

In the method of dispersing the pigment, known dispersing machines used widely in production of inks or toners and dispersing techniques can be suitably selected. Examples of suitable dispersing machines include a supersonic dispersing device, sand mill, attritor, pearl mill, super mill, ball mill, impeller, disperser, KD mill, colloid mill, dynatron, triple roll mill, press kneader, etc. These are described in detail in the aforementioned *Saishin Ganryho Oyo Gijyutsu* (Latest Newest Pigment Applied Technology) (published in 1986 by CMC Publishing Co., Ltd.).

The content of the dye or pigment in the image forming layer is preferably 0.01 to 50% by mass, and more preferably 0.1 to 10% by mass, based on the total solid content of the image forming layer. The content of the dye is particularly preferably 0.5 to 10% by mass, and the content of the pigment is particularly preferably 1.0 to 10% by mass. When the content is less than 0.01% by mass, sensitivity maybe lowered, however, when the content is higher than 50% by mass, the non-image region in the resulting planographic printing plate precursor may be tinted. The dye or pigment, together with other components, may be added to the same layer or to a separately arranged layer.

[Polymerization Initiator (B)]

In the invention, the polymerization initiator (B) refers to a compound generating radicals by irradiation with light in the wavelength range of 200 to 430 nm, or by heating at 100° C. or more.

As the polymerization initiator for initiation and progress of the curing reaction of the polymerizable compound (C) described later, a thermally decomposed radical-generating agent, which is decomposed by heat to generate radicals, is useful. The radical-generating agent is used in combination with the infrared absorbing agent described above to generate radicals via heat energy evolved by the infrared absorbing agent upon irradiation with an IR laser beam, and by this combination, heat-mode recording is feasible. When the laser irradiation energy is high, the infrared absorbing agent absorbs two photons, to enable photon-mode recording by absorption of the two photons.

Radical-generating agents include onium salts, triazine compounds having a trihalomethyl group, peroxides, azo-type polymerization initiators, azide compounds and quinone diazide, among which onium salts are highly sensitive and preferable. Hereinafter, the onium salts which can be preferably used as the radical polymerization initiator in the invention are described. Preferable examples of the onium salts include iodonium salts, diazonium salts and sulfonium salts. In the invention, these onium salts function not as acid generating agents but as radical polymerization initiators. The onium salts used preferably in the invention are onium salts represented by the following formulae (III) to (V):

$Ar^{11}—I^{+}—Ar^{12}\ Z^{11-}$ general formula (III)

$Ar^{21}—N^{+}\equiv N\ Z^{21-}$ general formula (IV)

general formula (V)

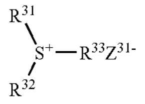

In formula (III), $Ar^{11}$ and $Ar^{12}$ each independently represents an aryl group containing 20 or less carbon atoms, which may have a substituent group. When this aryl group has a substituent group, the substituent group is preferably a halogen atom, a nitro group, an alkyl group containing 12 or less carbon atoms, an alkoxy group containing 12 or less carbon atoms, or an aryloxy group containing 12 or less carbon atoms. $Z^{11-}$ represents a counterion selected from the group consisting of a halogen ion, perchlorate ion, tetrafluoroborate ion, hexafluorophosphate ion, carboxylate ion and sulfonate ion, preferably a perchlorate ion, hexafluorophosphate ion, carboxylate ion and aryl sulfonate ion.

In formula (IV), $Ar^{21}$ represents an aryl group containing 20 or less carbon atoms, which may have a substituent group. The substituent is preferably a halogen atom, a nitro group, an alkyl group containing 12 or less carbon atoms, an alkoxy group containing 12 or less carbon atoms, an aryloxy group containing 12 or less carbon atoms, an alkylamino group containing 12 or less carbon atoms, a dialkyl amino group containing 12 or less carbon atoms, an aryl amino group containing 12 or less carbon atoms, or a diaryl amino group containing 12 or less carbon atoms. $Z^{21-}$ represents a counterion having the same meaning as defined for $Z^{11-}$.

In formula (V), $R^{31}$, $R^{32}$and $R^{33}$may be the same or different, and each represents a hydrocarbon group containing 20 or less carbon atoms, which may have a substituent group. The substituent is preferably a halogen atom, a nitro group, an alkyl group containing 12 or less carbon atoms, an alkoxy group containing 12 or less carbon atoms or an aryloxy group containing 12 or less carbon atoms. $Z^{31-}$ represents a counterion having the same meaning as defined for $Z^{11-}$.

Examples of the onium salts which can be used preferably as the radical-generating agent in the invention include those described in JP-A No. 2001-133696. Hereinafter, examples of theoniumsalts ([OI-1] to [OI-10]) represented by formula (III) which can be used preferably, the onium salts ([ON-1] to [ON-5]) represented by formula (IV), and the onium salts ([OS-1] to [OS-7]) represented by formula (V) are mentioned, but the onium salts are not limited thereto.

[0I-1]
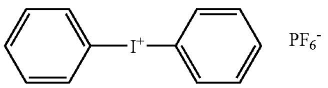
[0I-2]
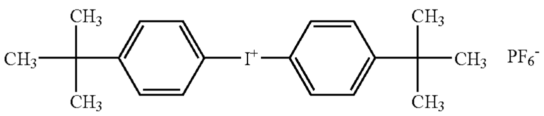
[0I-3]
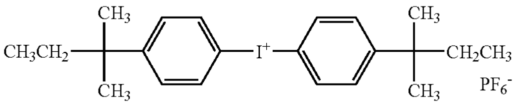
[0I-4]
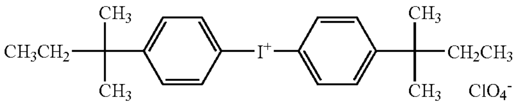
[0I-5]
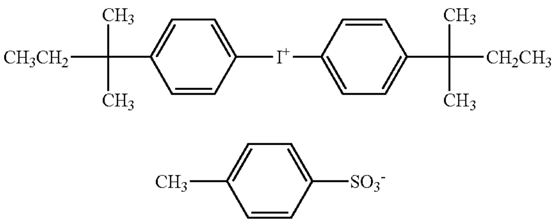
[0I-6]
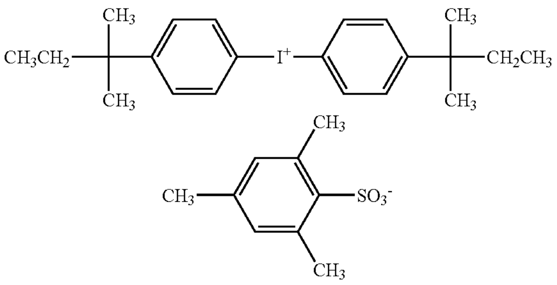
[0I-7]
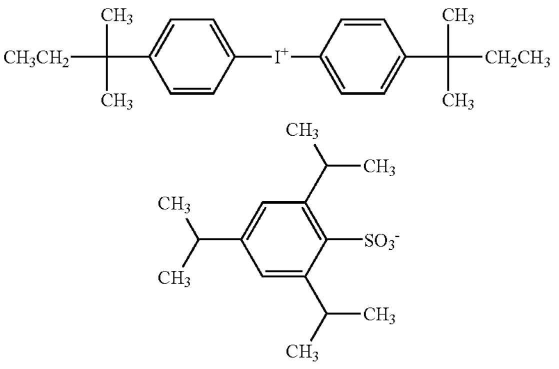
[0I-8]
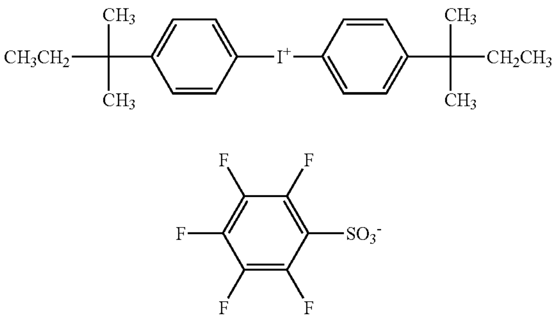
[0I-9]
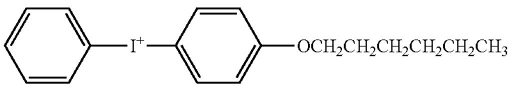
[0I-10]
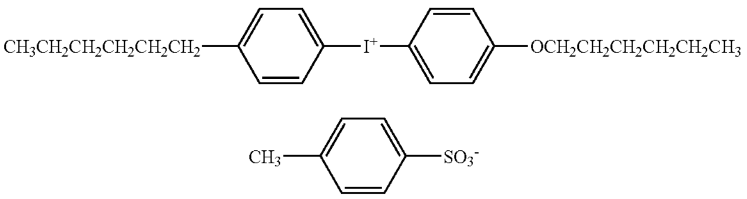
[0N-1]
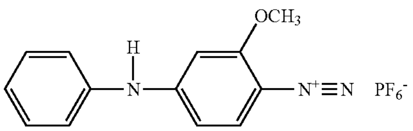
[0N-2]
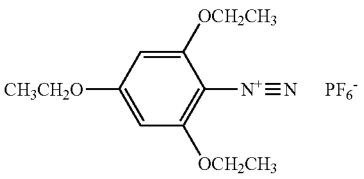

-continued
[0N-3]
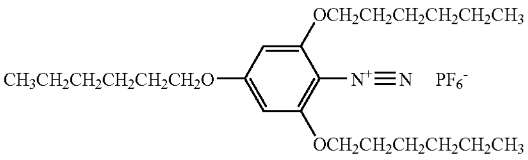
[0N-4]
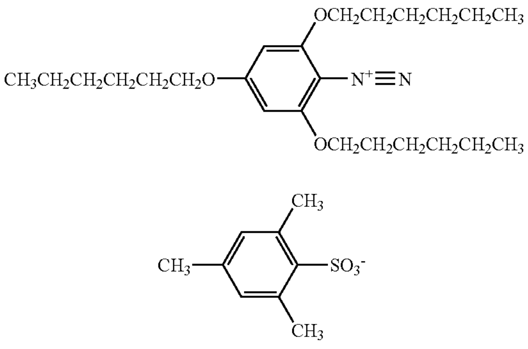
[0N-5]
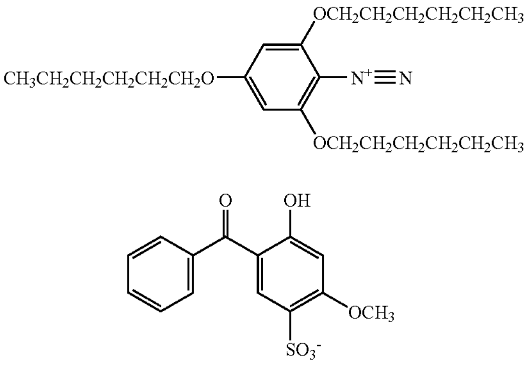
[0S-1]
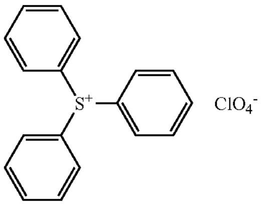
[0N-2]
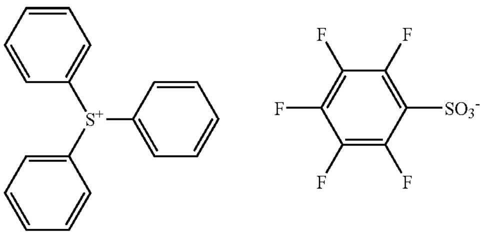
[0S-3]
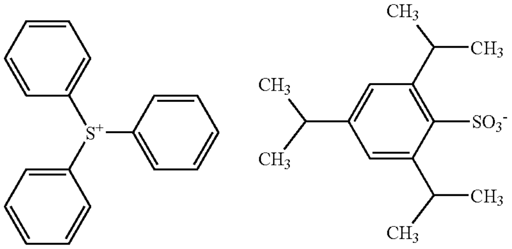
[0S-4]
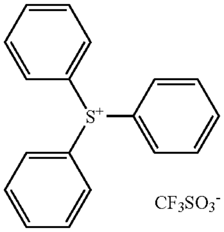
[0S-5]
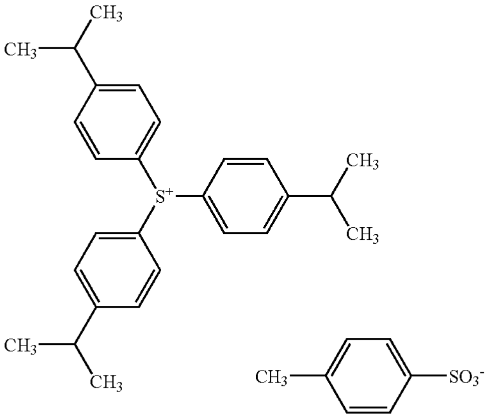

-continued

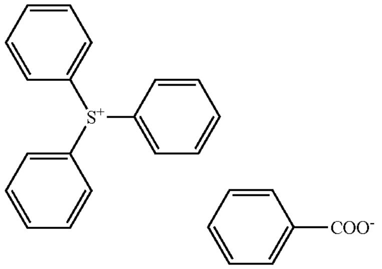

[0S-6]

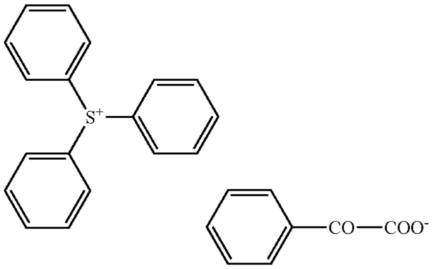

[0S-7]

The radical-generating agent used in the invention has a maximum absorption wavelength of preferably 400 nm or less, and more preferably 360 nm or less. By using the radical-generating agent having its absorption wavelength in the UV region, the planographic printing plate precursor can be handled under an incandescent lamp.

Other preferable polymerization initiators include specific aromatic sulfonium salts as described in Japanese Patent Application Laid-Open (JP-A) Nos. 2002-148790 (US 2002/0025489 A1) 2001-343742 and 2002-006482.

As other preferable polymerization initiators usable in the invention, typical compounds described in Japanese Patent Application Laid-Open (JP-A) No. 2002-148790(US 2002/0025489 A1) are shown below:

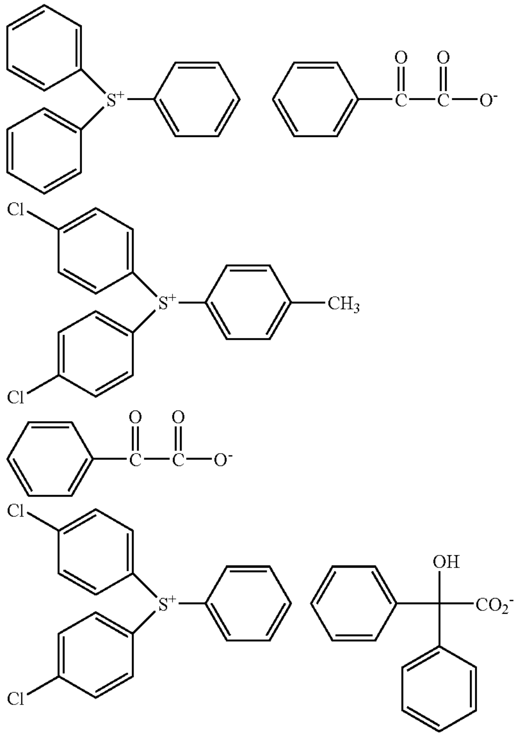

The polymerization initiator can be added in an amount of 0.1 to 50% by mass, preferably 0.5 to 30% by mass, more preferably 1 to 20% by mass, relative to the total solid content in the photosensitive layer. When the amount of the polymerization initiator added is less than 0.1% by mass, the sensitivity is lowered, while when the amount is higher than 50% by mass, the non-image area maybe easily tinted in printing. These polymerization initiators may be used alone or as a mixture of two or more thereof. The polymerization initiator, along with other components, may be added to the same layer or to a separately provided layer.

[(C) Polymerizable Compound]

The addition-polymerizable compound containing at least one ethylenically unsaturated double bond, used in the heat-polymerizable negative type photosensitive layer, is selected from compounds each having at least one (preferably two or more) ethylenically unsaturated bond(s). A group of such compounds is known widely in the industry, and in the invention, these compounds can be used without any particular limitation. These compounds occur in chemical forms such as monomers, prepolymers, that is, dimers, trimers and oligomers, as well as mixtures and copolymers thereof. Examples of such monomers and copolymers include unsaturated carboxylic acids (e.g., acrylic acid, methacrylic acid, itaconic acid, crotonic acid, isocrotonic acid, maleic acid, etc.) and esters and amides thereof, and preferably used among these compounds are esters between unsaturated carboxylic acids and aliphatic polyvalent alcohols and amides between unsaturated carboxylic acids and aliphatic polyvalent amines. Also preferably used among these compounds are unsaturated carboxylates having nucleophilic substituent groups such as a hydroxyl group, amino group, mercapto group, etc., addition-reaction products of amides with monofunctional or multifunctional isocyanates or epoxy compounds, and dehydration condensation reaction products of amides with monofunctional or multifunctional carboxylic acids. Also preferably used among these compounds are unsaturated carboxylates having electrophilic substituent groups such as an isocyanate group, epoxy group, etc., addition-reaction products of amides with monofunctional or multifunctional alcohols, amines or thiols; unsaturated carboxylates having releasing substituent groups such as a halogen atom, tosyloxy group, etc.; and substitution-reaction products of amides with monofunctional or multifunctional alcohols, amines or thiols. Use can also be made of a group of those compounds wherein the above-described carboxylic acids have been replaced by unsaturated phosphonic acids, styrene, vinyl ethers, etc.

As the ester monomers between aliphatic polyvalent alcohols and unsaturated carboxylic acids, the acrylates include ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri (acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl) isocyanurate, polyester acrylate oligomers, etc.

The methacrylates include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl]dimethyl methane, bis[p-(methacryloxyethoxy)phenyl]dimethyl methane, etc.

The itaconates include ethylene glycol diitaconate, propylene glycol diitaconate, 1,3-butane diol diitaconate, 1,4-butane diol diitaconate, tetramethylene glycol diitaconate, pentaerythritol diitaconate, sorbitol tetraitaconate, etc. The crotonates include ethylene glycol dicrotonate, tetramethylene glycol dicrotonate, pentaerythritol dicrotonate, sorbitol tetradicrotonate, etc. The isocrotonates include ethylene glycol diisocrotonate, pentaerythritol diisocrotonate, sorbitol tetraisocrotonate, etc. The maleates include ethylene glycol dimaleate, triethylene glycol dimaleate, pentaerythritol dimaleate, sorbitol tetramaleate, etc.

Other preferably used esters include, for example, aliphatic alcohol-based esters as described in JP-B Nos. 46-27926, 51-47334 and JP-A No. 57-196231; those having an aromatic skeleton as described in JP-A Nos. 59-5240, 59-5241 and 2-226149; and those having an amino group described in JP-A No. 1-165613. The ester monomers can also be used as a mixture.

As the monomers, the amides between aliphatic polyvalent amines and unsaturated carboxylic acids include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, xylylene bismethacrylamide, etc. Preferable examples of other amide type monomers include those having a cyclohexylene structure described in JP-B No. 54-21726.

Urethane type addition-polymerizable compounds produced by addition reaction between isocyanates and hydroxyl groups are also preferable, and examples thereof include vinyl urethane compounds containing two or more polymerizable vinyl groups in one molecule, which are prepared by adding vinyl monomers containing a hydroxyl group shown in formula (II) below to polyisocyanates having two or more isocyanate groups in one molecule as described in JP-B 48-41708.

$$CH_2{=}C(R_4)COOCH_2CH(R_5)OH \qquad (II)$$

In formula (II) $R_4$ and $R_5$ each independently represents H or $CH_3$.

The urethane acrylates as described in JP-A No. 51-37193, JP-B Nos. 2-32293and 2-16765, and the urethane compounds having an ethylene oxide-type skeleton described in JP-B Nos. 58-49860, 56-17654, 62-39417 and 62-39418 are also preferable. Addition-polymerizable compounds having an amino structure or sulfide structure in the molecule as described in JP-A Nos. 63-277653, 63-260909 and 1-105238 can be used to prepare highly sensitive photopolymerizable compositions.

Other examples include multifunctional acrylates and methacrylates such as polysesteracrylates and the epoxy acrylates obtained by reacting epoxy resin with (meth)acrylic acid as described in JP-A No. 48-64183, JP-B Nos. 49-43191 and 52-30490, respectively. Specific unsaturated compounds as described in JP-B Nos. 46-43946, 1-40337 and 1-40336, and vinyl phosphonic acid-type compounds as described in JP-A No. 2-25493 can also be mentioned. In some cases, a structure containing a perfluoroalkyl group as described in JP-A No. 61-22048 is preferably used. The photosetting monomers and oligomers described in the *Journal of Japanese Adhesive Society*, vol. 20, No. 7, pp. 300-308 (1984) can also be used.

Methods for using these addition-polymerizable compounds such as structures of the compounds, uses thereof singly or in combination, and the addition amount thereof, can be optionally determined depending on the desired performance and design of the final planographic printing plate precursor. For example, depending on the following factors, they are selected as follows. In respect of photosensitivity, their structure preferably has many unsaturated groups in one molecule, and in many cases, they are preferably bifunctional or more.

In order to increase the strength of an image area, i.e., the cured layer, the compounds are preferably trifunctional or more. It is also effective to use a method of controlling both photosensitivity and layer strength by combined use of compounds (e.g., acrylates, methacrylates, styrene type compounds, and vinyl ether type compounds) having different functionalities and different polymerizable groups. The high-molecular compounds or highly hydrophobic compounds, though being excellent in photosensitivity and layer strength, may be undesirable in some cases when considering developing speed and precipitation in the developing solution. The method of selecting and using the addition-polymerizable compound is an important factor for compatibility and dispersibility with other components (e.g., a binder polymer, an initiator, a coloring agent, etc.) in the photosensitive layer, and the compatibility may be improved by, for example, using a low-purity compound or a combination of two or more compounds. A specific structure can be selected for the purpose of improving adhesiveness to a substrate or an overcoat layer, described later. The ratio of the addition-polymerizable compound blended in the photosensitive layer is advantageously higher for sensitivity, but if the ratio is too high, this causes undesirable phase separation, problems in the production process caused by the adhesiveness of the photosensitive layer (e.g., production failure due to transfer and adhesion of components in the photosensitive layer), and precipitation from the developing solution. From these viewpoints, the addition-polymerizable compounds are used in the range of preferably 5 to 80% by mass, more preferably 25 to 75% by mass, based on nonvolatile components in the photosensitive layer. These compounds may be used singly or in combination thereof. From the viewpoints of the degree of inhibition of polymerization by oxygen, resolution, fogging, change in reflectance, and surface adhesiveness, a suitable structure, compounding and amount thereof can be appropriately selected in the method of using the addition-polymerizable compound, and further, a layer structure and a coating method such as undercoating and overcoating can also be carried out as necessary.

[(D) Binder Polymer]

From the viewpoint of improving layer-forming properties, the photosensitive layer in the invention preferably comprises a binder polymer, particularly preferably a binder polymer having a repeating unit represented by formula (I) (also referred to as the specific binder polymer):

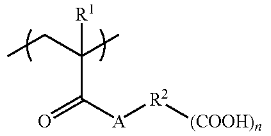
(I)

$R^1$ represents a hydrogen atom or a methyl group; $R^2$ represents a linking group composed of two or more atoms selected from the group consisting of a carbon atom, a hydrogen atom, an oxygen atom, a nitrogen atom and a sulfur atom wherein the number of atoms is 2 to 82; A represents an oxygen atom or —$NR^3$— whereupon $R^3$ represents a hydrogen atom or a monovalent hydrocarbon group having 1 to 10 carbon atoms; and n is an integer of 1 to 5.

$R^1$ in formula (I) represents a hydrogen atom or a methyl group, preferably a methyl group.

The linking group represented by $R^2$ in formula (I) is a linking group composed of two or more atoms selected from the group consisting of a carbon atom, a hydrogen atom, an oxygen atom, a nitrogen atom, and a sulfur atom, wherein the number of atoms is 2 to 82, preferably 2 to 50, and more preferably 2 to 30. The number of atoms refers to the number of atoms including atoms in a substituent group, if any, on the linking group.

Specifically, the number of carbon atoms in the main skeleton of the linking group represented by $R^2$ is preferably 1 to 30, more preferably 3 to 25, still more preferably 4 to 20, and most preferably 5 to 10. The phrase "main skeleton of the linking group" in the invention refers to an atom or an atomic group used in linking A to the terminal COOH in formula (I), and, in particular, when a plurality of linkages are present, the main skeleton refers to an atom or an atomic group constituting a linkage having the smallest number of atoms. Accordingly, when the linking group has a cyclic structure, its linking sites (for example, o-, m-, p-, etc.) are different in the number of atoms to be introduced into them.

Linking groups in the chain structure include ethylene, propylene, etc. A structure comprising these alkylene groups bound to one another via ester linkages is also preferable.

The linking group represented by $R^2$ in formula (I) is preferably a (n+1)-valent hydrocarbon group having analicyclic structure having 3 to 30 carbon atoms. Examples thereof include (n+1)-valent hydrocarbon groups obtained by removing (n+1) hydrogen atoms on arbitrary carbon atoms constituting compounds having an alicyclic structure, such as cyclopropane, cyclopentane, cyclohexane, cycloheptane, cyclooctane, cyclodecane, dicyclohexyl, tertiary cyclohexyl and norbornane which may be substituted with one or more arbitrary substituent groups. $R^2$ is preferably the one containing 3 to 30 carbon atoms including carbon atoms in a substituent group if any.

The arbitrary carbon atoms in a compound constituting an alicyclic structure may be substituted with one or more heteroatoms selected from the group consisting of a nitrogen atom, an oxygen atom and a sulfur atom. In terms of printing durability, $R^2$ is preferably a (n+1)-valent hydrocarbon group having an alicyclic structure which may have a substituent group having 5 to 30 carbon atoms comprising two or more rings, such as a condensed polycyclic aliphatic hydrocarbon, a crosslinked alicyclic hydrocarbon, spiroaliphatic hydrocarbon, and combined aliphatic hydrocarbon rings (plural rings combined directly or via linking groups). The number of carbon atoms refers to the number of carbon atoms including carbon atoms in a substituent group, if any.

The linking group represented by $R^2$ is preferably a group containing 5 to 10 atoms, having a cyclic structure containing an ester linkage or the cyclic structure described above.

A substituent group which can be introduced into the linking group represented by $R^2$ includes a monovalent non-metal atomic group excluding hydrogen, and examples thereof include a halogenatom (—F, —Br, —Cl, —I), hydroxyl group, alkoxy group, aryloxy group, mercapto group, alkyl thio group, aryl thio group, alkyl dithio group, aryl dithio group, amino group, N-alkyl amino group, N,N-dialkyl amino group, N-aryl amino group, N,N-diaryl amino group, N-alkyl-N-aryl amino group, acyloxy group, carbamoyloxy group, N-alkylcarbamoyloxy group, N-aryl carbamoyloxy group, N,N-dialkyl carbamoyloxy group, N,N-diaryl carbamoyloxy group, N-alkyl-N-aryl carbamoyloxy group, alkyl sulfoxy group, aryl sulfoxy group, acyl thio group, acyl amino group, N-alkyl acyl amino group, N-aryl acyl amino group, ureido group, N'-alkyl ureido group, N',N'-dialkyl ureido group, N'-aryl ureido group, N',N'-diaryl ureido group, N'-alkyl-N'-aryl ureido group, N-alkyl ureido group, N-aryl ureido group, N'-alkyl-N-alkyl ureido group, N'-alkyl-N-aryl ureido group, N',N'-dialkyl-N-alkyl ureido group, N',N'-dialkyl-N-aryl ureido group, N'-aryl-N-alkyl ureido group, N'-aryl-N-aryl ureido group, N',N'-diaryl-N-alkyl ureido group, N',N'-diaryl-N-aryl ureido group, N'-alkyl-N'-aryl-N-alkyl ureido group, N'-alkyl-N'-aryl-N-aryl ureido group, alkoxy carbonyl amino group, aryloxy carbonyl amino group, N-alkyl-N-alkoxycarbonyl amino group, N-alkyl-N-aryloxy carbonyl amino group, N-aryl-N-alkoxycarbonyl amino group, N-aryl-N-aryloxycarbonyl amino group, formyl group, acyl group, carboxyl group and its conjugated basic group, alkoxy carbonyl group, aryloxy carbonyl group, carbamoyl group, N-alkyl carbamoyl group, N,N-dialkyl carbamoyl group, N-aryl carbamoyl group, N,N-diaryl carbamoyl group, N-alkyl-N-aryl carbamoyl group, alkyl sulfinyl group, aryl sulfinyl group, alkyl sulfonyl group, aryl sulfonyl group, sulfo group (—$SO_3H$) and its conjugated basic group, alkoxy sulfonyl group, aryloxy sulfonyl group, sulfinamoyl group, N-alkyl sulfinamoyl group, N,N-dialkyl sulfinamoyl group, N-aryl sulfinamoyl group, N,N-diaryl sulfinamoyl group, N-alkyl-N-aryl sulfinamoyl group, sulfamoyl group, N-alkyl sulfamoyl group, N,N-dialkyl sulfamoyl group, N-aryl sulfamoyl group, N,N-diaryl sulfamoyl group, N-alkyl-N-aryl sulfamoyl group, N-acyl sulfamoyl group and its conjugated basic group, N-alkyl sulfonyl sulfamoyl group (—$SO_2NHSO_2$(alkyl)) and its conjugated basic group, N-aryl sulfonyl sulfaamoyl group (—$SO_2NHSO_2$(aryl)) and its conjugated basic group, N-alkyl sulfonyl carbamoyl group (—$CONHSO_2$ (alkyl)) and its conjugated basic group, N-aryl sulfonyl carbamoyl group (—$CONHSO_2$(aryl)) and its conjugated basic group, alkoxy silyl group (—Si(O-alkyl)$_3$), aryloxy silyl group (—Si(O-aryl)$_3$), hydroxylyl group (—Si $(OH)_3$) and its conjugated basic group, pohsphono group (—$PO_3H_2$) and its conjugated basic group, dialkyl phosphono group (—$PO_3$(alkyl)$_2$), diaryl phosphono group (—$PO_3$(aryl)$_2$), alkyl aryl phosphono group (—$PO_3$(alkyl) (aryl)), monoalkyl phosphono group (—$PO_3H$(alkyl)) and its conjugated basic group, monoaryl phosphono group (—$PO_3H$(aryl)) and its conjugated basic group, phosphonoxy group (—$OPO_3H_2$) and its conjugated basic group, dialkyl phosphonoxy group (—$OPO_3$(alkyl)$_2$), diaryl phosphonoxy group (—$OPO_3$(aryl)$_2$), alkyl aryl phosphonoxy group (—$OPO_3$(alkyl) (aryl)), monoalkyl phosphonoxy group (—$OPO_3H$(alkyl)) and its conjugated basic group, monoaryl phosphonoxy group (—$OPO_3H$(aryl)) and its conjugated basic group, cyano group, nitro group, dialkyl boryl group (—$B(alkyl)_2$), diaryl boryl group (—$B(aryl)_2$), alkyl aryl boryl group (—B(alkyl) (aryl)), dihydroxy boryl group (—B $(OH)_2$) and its conjugated basic group, alkyl hydroxy boryl group (—B(alkyl) (OH)) and its conjugated basic group, aryl hydroxy boryl group (—B(aryl) (OH)) and its conjugated basic group, aryl group, alkenyl group and alkynyl group.

Depending on the design of the photosensitive layer, a substituent group having a hydrogen atom capable of hydrogen bonding, particularly a substituent group having acidity whose acid dissociation constant (pKa) is lower than that of carboxylic acid, is not preferable because it tends to deteriorate printing durability. On the other hand, a hydrophobic substituent group such as a halogen atom, a hydrocarbon group (alkyl group, aryl group, alkenyl group, alkynyl group), an alkoxy group and an aryloxy group is preferable because it tends to improve printing durability, and particularly when the cyclic structure is a 6- or less memberred monocyclic aliphatic hydrocarbon such as cyclopentane or cyclohexane, the hydrocarbon preferably has such hydrophobic substituent groups. If possible, these substituent groups may be bound to one another or to a substituted hydrocarbon group to form a ring, and the substituent groups may further be substituted.

When A in formula (I) is $NR^3$—, $R^3$ represents a hydrogen atom or a monovalent hydrocarbon group having 1 to 10 carbon atoms. The monovalent hydrocarbon group having 1 to 10 carbon atoms represented by $R^3$ includes an alkyl group, aryl group, alkenyl group and alkynyl group.

Examples of the alkyl group having 1 to 10 carbon atoms include a linear, branched or cyclic alkyl group such as a methyl group, ethyl group, propyl group, butyl group, pentyl group, hexyl group, heptyl group, octyl group, nonyl group, decyl group, isopropyl group, isobutyl group, sec-butyl group, tert-butyl group, isopentyl group, neopentyl group, 1-methylbutyl group, isohexyl group, 2-ethylhexyl group, 2-methylhexyl group, cyclopentyl group, cyclohexyl group, 1-adamanthyl group and 2-norbornyl group.

Examples of the aryl group having 1 to 10 carbon atoms include an aryl group such as a phenyl group, naphthyl group and indenyl group, a heteroaryl group having 1 to 10 carbon atoms containing one heteroatom selected from the group consisting of a nitrogen atom, an oxygen atom and a sulfur atom, for example a furyl group, thienyl group, pyrrolyl group, pyridyl group and quinolyl group.

Examples of the alkenyl group having 1 to 10 carbon atoms include a linear, branched or cyclic alkenyl group such as a vinyl group, 1-propenyl group, 1-butenyl group, 1-methyl-1-propenyl group, 1-cyclopentenyl group and 1-cyclohexenyl group.

Examples of the alkynyl group include an alkynyl group having 1 to 10 carbon atoms such as an ethynyl group, 1-propynyl group, 1-butynyl group and 1-octynyl group. Substituent groups which may be possessed by R include the same substituent groups as those capable of being introduced into $R^2$. The number of carbon atoms in $R^3$, including the number of carbon atoms in its substituent group, is 1 to 10.

A in the formula (I) is preferably an oxygen atom or —NH— because of easy synthesis.

n in the formula (I) is an integer of 1 to 5, preferably 1 in view of printing durability.

Preferable examples of the repeating unit represented by the formula (I) in the specific binder polymer are shown below, but the invention is not limited thereto.

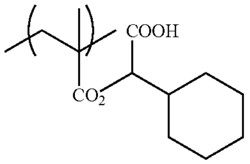

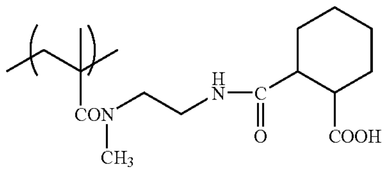

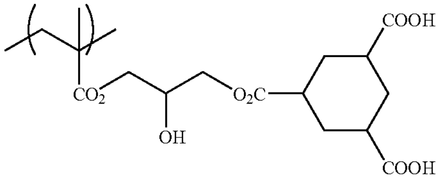

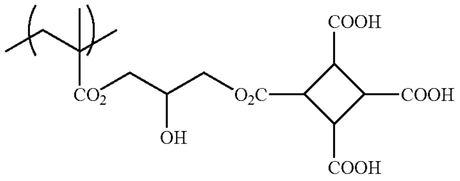

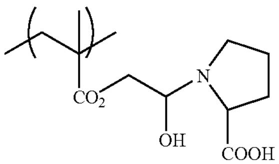

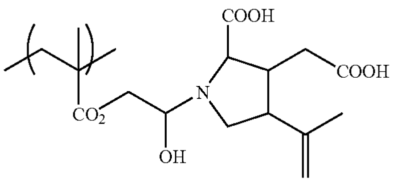

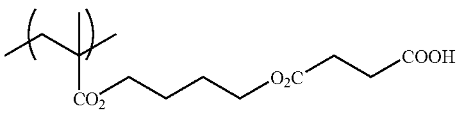

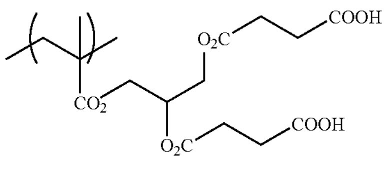

-continued
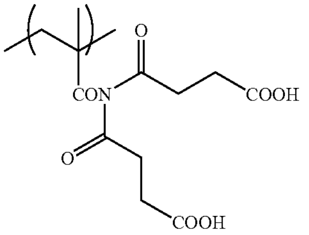
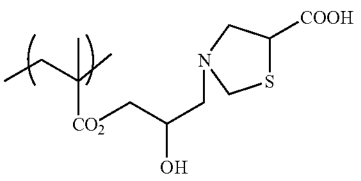
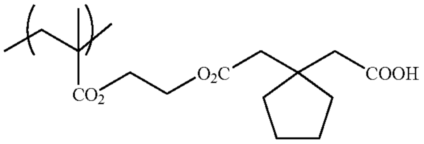
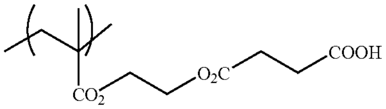
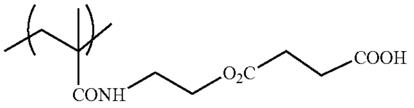
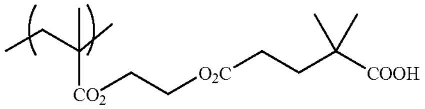
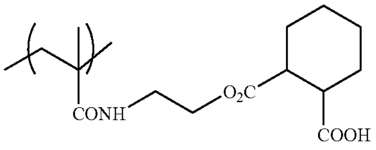
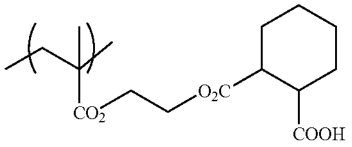
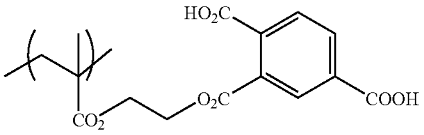
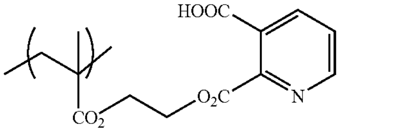
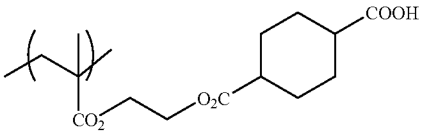
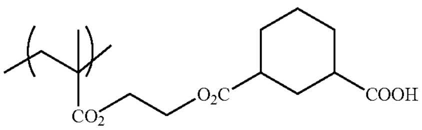
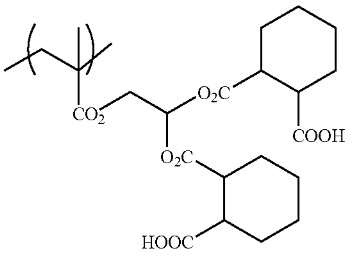
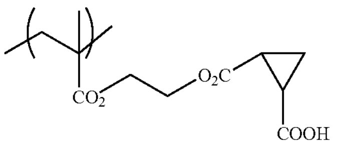
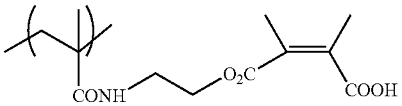
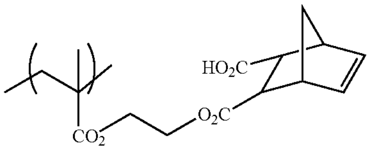
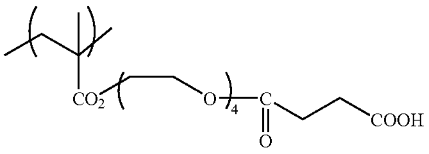
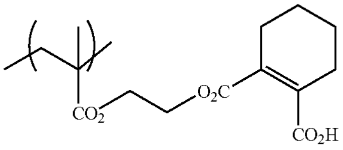
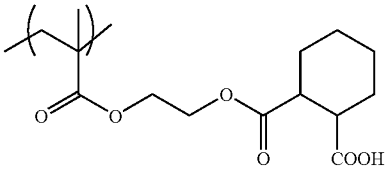
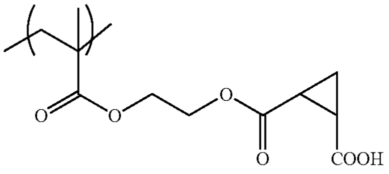

-continued
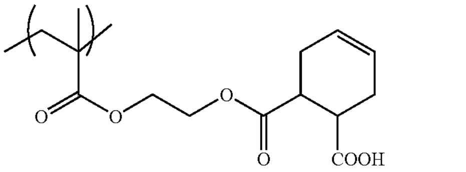
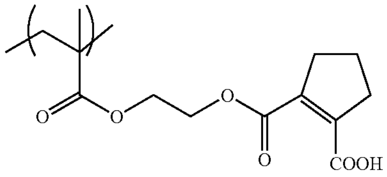
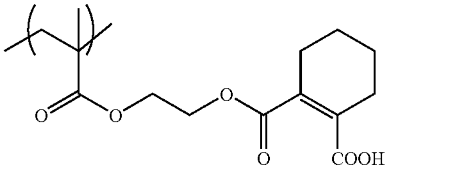
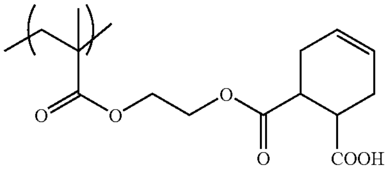
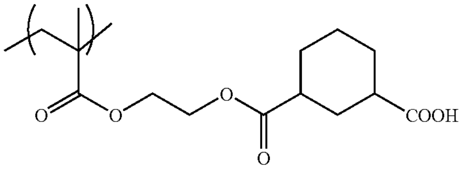
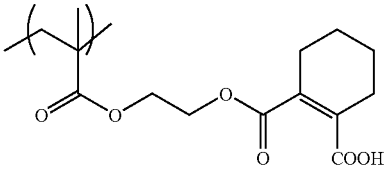
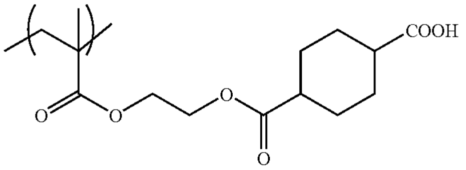
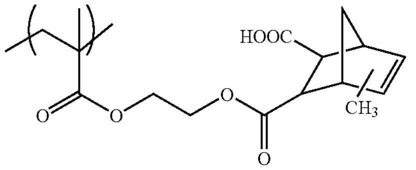
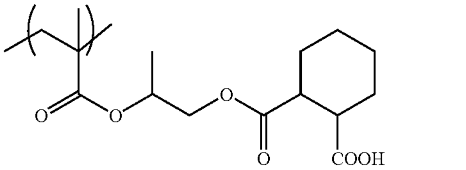
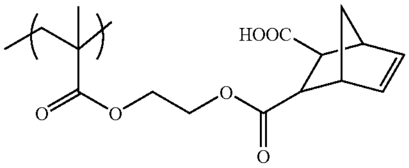
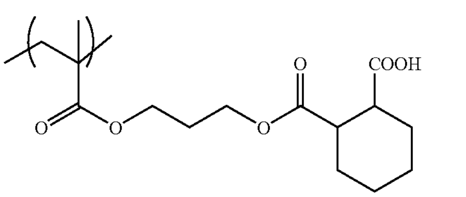
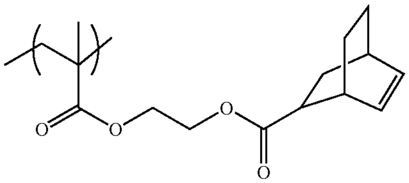
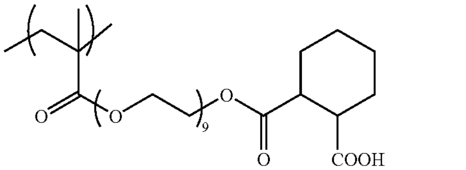
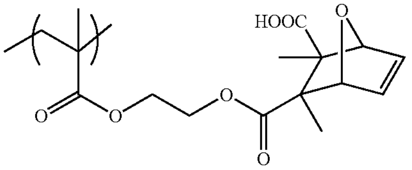
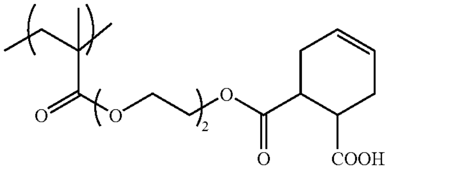
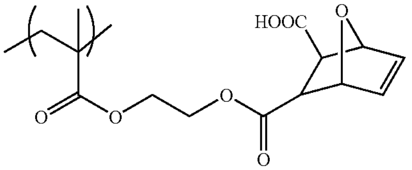
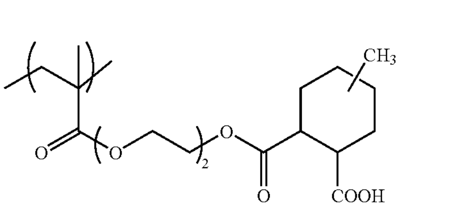
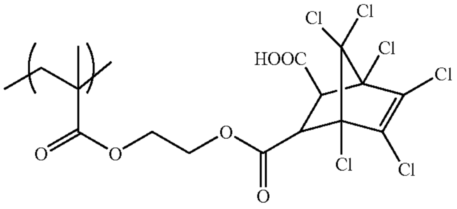

-continued
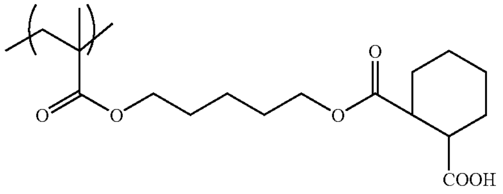
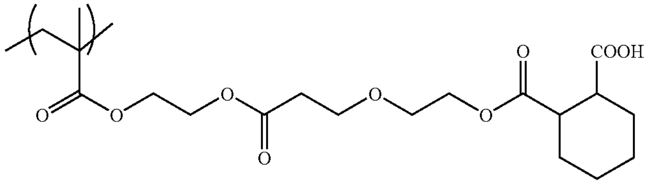
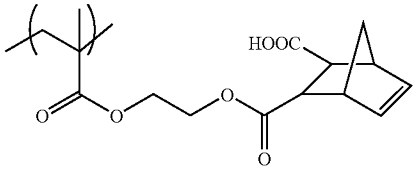
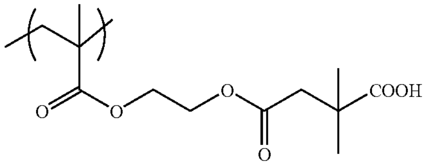
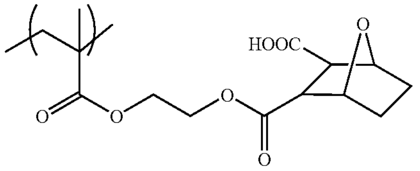
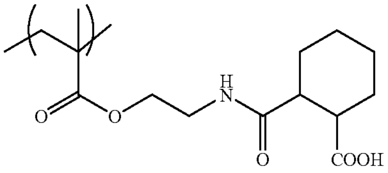
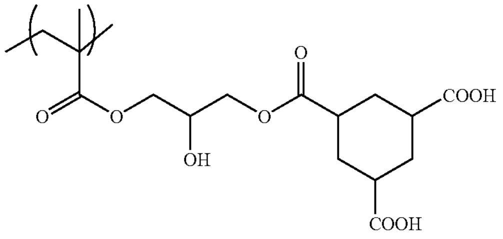
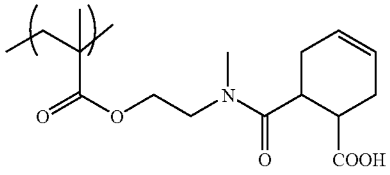
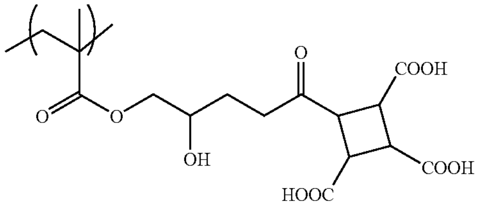
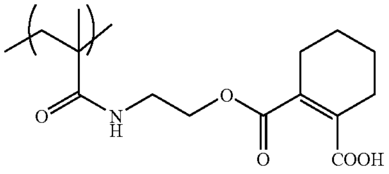
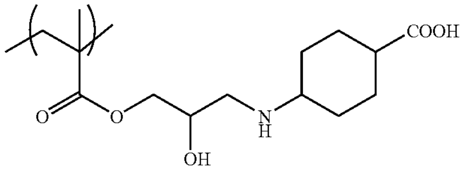
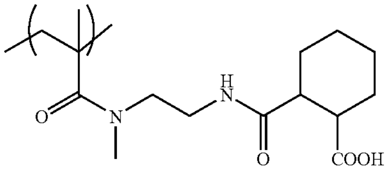
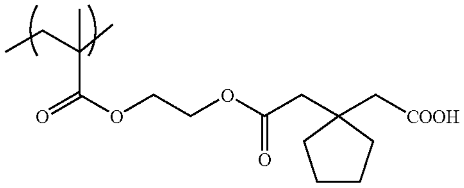
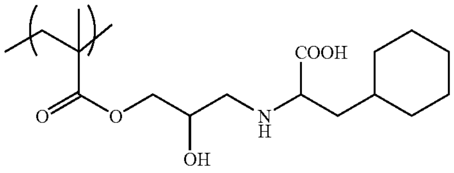

-continued
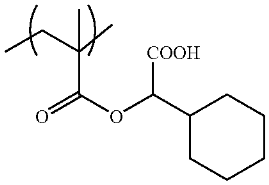
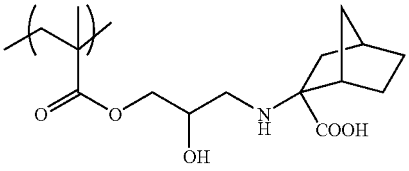
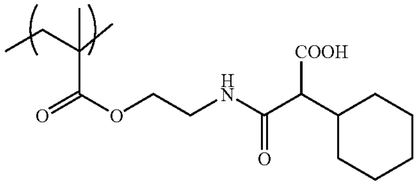
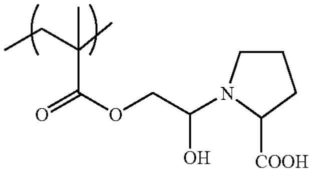
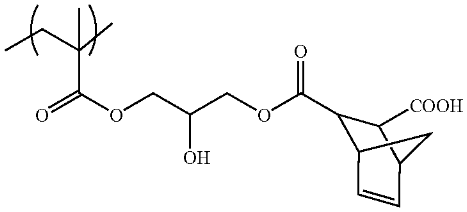
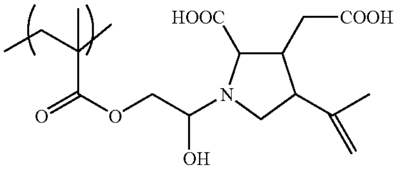
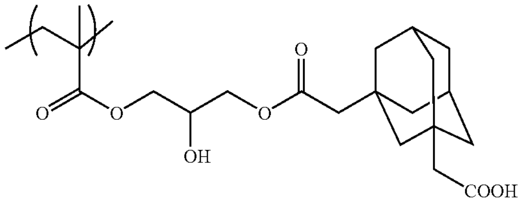
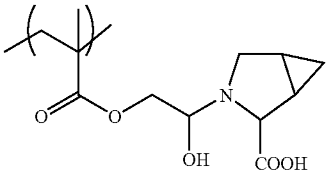
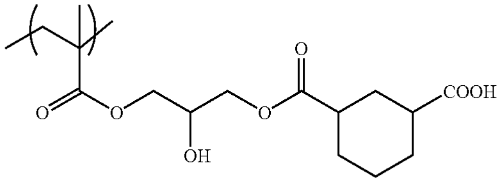
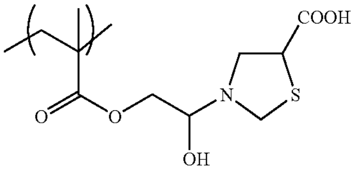
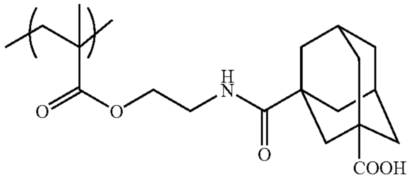
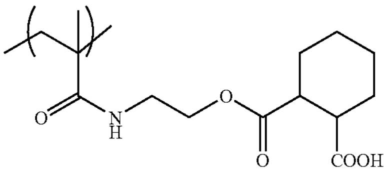
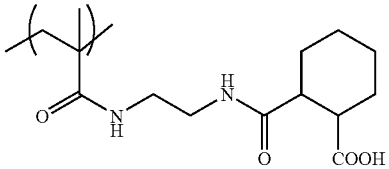
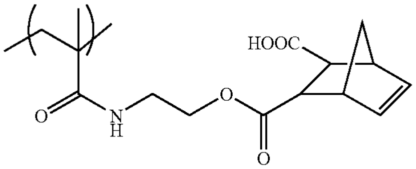
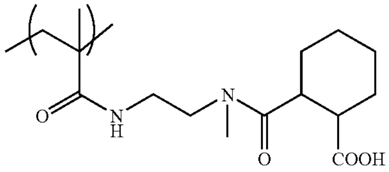
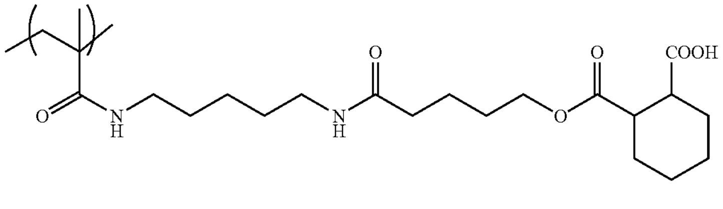

-continued
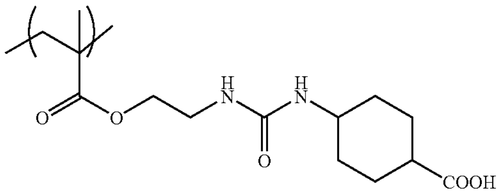
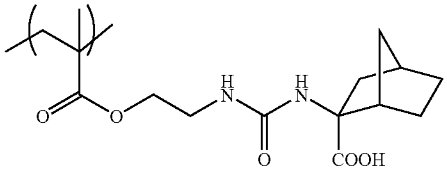
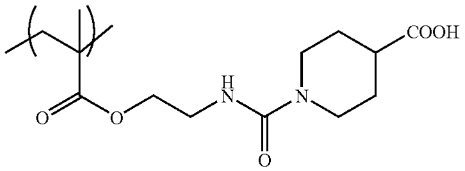
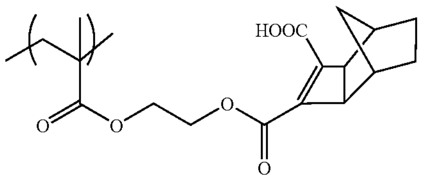
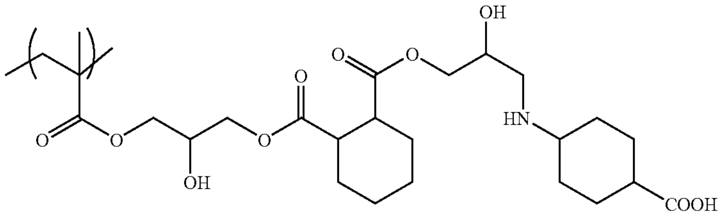
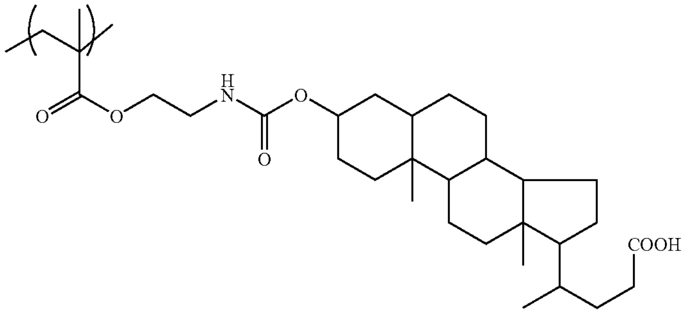
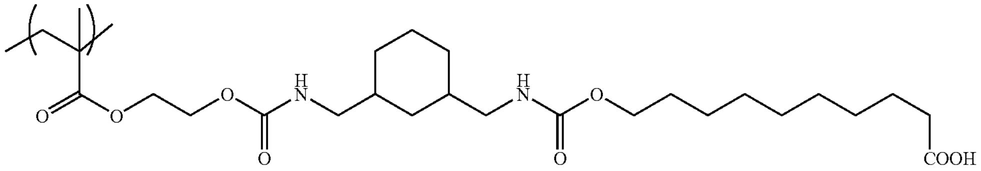
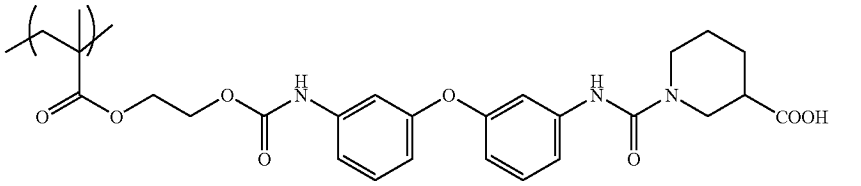
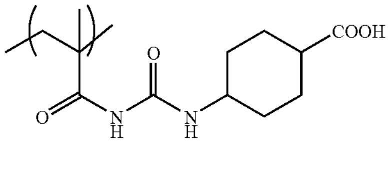
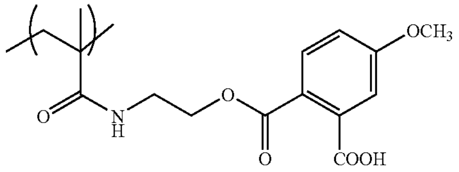
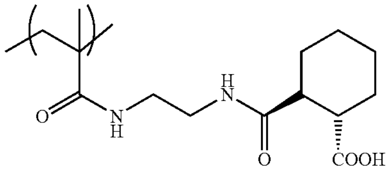
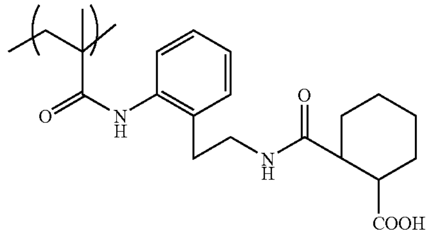

-continued

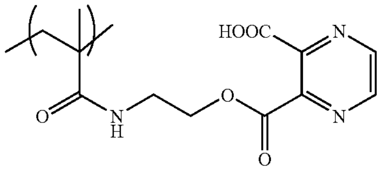

One or two or more kinds of repeating unit represented by formula (I) may be contained in the binder polymer. The specific binder polymer in the invention may be a polymer composed exclusively of the repeating unit represented by formula (I), but is usually used as a copolymer containing other copolymerizable components. The total content of the repeating unit represented by formula (I) in the copolymer is suitably determined depending on the structure of the copolymer, design of the photosensitive layer, etc., but usually the repeating unit is contained in an amount of 1 to 99% by mole, more preferably 5 to 40% by mole, and still more preferably 5 to 20% by mole, based on the total molar amount of the polymer components.

When a copolymer is used as the binder polymer, copolymerizable components known in the art can be used without limitation insofar as they are radical-polymerizable monomers. Specifically, monomers described in the *Polymer Data Handbook—Fundamental Version*—compiled by the Society of Polymer Science, Japan and published by Baifukan, 1986 are exemplified. Such copolymerizable components can be used alone or in combination.

The molecular weight of the specific binder polymer in the invention is suitably determined from the viewpoint of image-forming property and printing durability. Usually, when the molecular weight is increased, printing durability is improved but the image-forming property tends to be deteriorated. On the other hand, when the molecular weight is decreased, the image-forming property is improved, while printing durability is deteriorated. The molecular weight is preferably in the range of 2,000 to 1,000,000, more preferably 5,000 to 500,000, and still more preferably 10,000 to 200,000.

As the binder polymer used in the photosensitive layer in the planographic printing plate precursor of the invention, the specific binder polymer may be used alone, or may be used in combination with one or more other binder polymers. When the specific binder is used, binder polymers used in combination therewith are used in the range of 1 to 60% by mass, preferably 1 to 40% by mass, and more preferably 1 to 20% by mass, based on the total weight of the binder polymer components. As the binder polymer, any known binder polymers can be used without limitation, and specifically an acrylic main-chain binder and an urethane binder used often in this field are preferably used.

The total amount of the specific binder polymer and binder polymers which can be used in combination therewith in the photosensitive layer can be suitably determined, and is usually 10 to 90% by mass, preferably 20 to 80% by mass, and more preferably 30 to 70% by mass, based on the total weight of nonvolatile components in the photosensitive layer.

The acid value (meg/g) of the binder polymer is preferably in the range of 2.00 to 3.60.

(Other Binder Polymers Usable in Combination)

The binder polymer which can be used in combination with the specific binder polymer is preferably a binder polymer having a radical-polymerizable group. The radical-polymerizable group is not particularly limited insofar as it can be polymerized with a radical, and examples thereof include a-substituted methyl acryl group [—OC(═O)—C(—$CH_2Z$)═$CH_2$ wherein Z is a hydrocarbon group starting from a heteroatom], acryl group, methacryl group, allyl group and styryl group, among which an acryl group and methacryl group are preferable.

The content of the radical-polymerizable group in the binder polymer (content of radical-polymerizable unsaturated double bonds determined by iodine titration) is preferably 0.1 to 10.0 mmol, more preferably 1.0 to 7.0 mmol, and most preferably 2.0 to 5.5 mmol, per g of the binder polymer. When this content is lower than 0.1 mmol, the curing properties may be deteriorated to be less sensitive. When the content is higher than 10.0 mmol, stability maybe lost and shelf stability may deteriorate.

Preferably, the binder polymer further has an alkali-soluble group. The content of the alkali-soluble group (acid value determined by neutralization titration) in the binder polymer is preferably 0.1 to 3.0 mmol, more preferably 0.2 to 2.0 mmol, and most preferably 0.45 to 1.0 mmol, per g of the binder polymer. When the content is lower than 0.1 mmol, the binder polymer may be precipitated during development to generate development scum. When the content is higher than 3.0 mmol, the hydrophilicity of the binder polymer may be too high, thus deteriorating printing durability.

The weight-average molecular weight of the binder polymer is in the range of preferably 2,000 to 1,000,000, more preferably 10,000 to 300,000, and most preferably 20,000 to 200,000. When the weight-average molecular weight is less than 2,000, the layer-forming property may be lowered to deteriorate printing durability. When the weight-average molecular weight is greater than 1,000,000, it may be difficult to dissolve the binder polymer in a coating solvent, thus lowering the coating property.

The glass transition point (Tg) of the binder polymer is in the range of preferably 70° to 300° C., more preferably 80° to 250° C., and most preferably 90° to 200° C. When the glass transitionpoint is lower than 70° C., storability may become poor, thus deteriorating printing durability. When the glass transition point is higher than 300° C., the mobility of radicals in the photosensitive layer may be lowered, thus making sensitivity low.

As a means of increasing the glass transition point of the binder polymer, its molecule preferably contains an amide group or imide group, and particularly preferably contains methacrylamide derivatives.

[(E) Additives]

In addition to the fundamental components described above, other components suitable for use, process, etc., can be added to a heat-polymerizable negative type photosensitive layer preferable as the photosensitive layer in the planographic printing plate precursor of the invention as necessary, such as various additives like coloring agents, plasticizers and polymerization inhibitors. Hereinafter, preferable examples of the additives are described.

(Polymerization Inhibitor)

A small amount of a heat-polymerization inhibitor is preferably added to the photosensitive layer in the planographic printing plate precursor of the invention in order to inhibit undesired heat polymerization of the polymerizable compound having an ethylenically unsaturated double bond, either during the production or storage of the negative type photosensitive composition. Preferable examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), N-nitrosophenyl hydroxylamine primary cerium salts, etc. The amount of the heat-polymerization inhibitor added is preferably about 0.01 to about 5% by mass relative to the weight of nonvolatile components in the entire composition. To prevent the inhibition of polymerization by oxygen, a higher fatty acid derivative such as behenic acid or behenic amide may be added as necessary so that it is allowed to be locally present on the surface of the photosensitive layer in the drying step after application. The amount of the higher fatty acid derivative added is preferably about 0.5 to about 10% by mass relative to nonvolatile components in the entire composition.

(Coloring Agent)

Dyes or pigments may be added to the photosensitive layer in the planographic printing plate precursor of the invention for the purpose of coloring the photosensitive layer. The plate-checking property, that is, the visibility of the printing plate after plate-making and the applicability for image densitometer can thereby be improved. When dyes are used as the coloring agent, many of these can cause a reduction in the sensitivity of the photo-polymerizable photosensitive layer, and thus, it is particularly preferable to use pigments as the coloring agent. Examples of the coloring agent include pigments such as phthalocyanine type pigments, azo type pigments, carbon black and titanium oxide, and dyes such as ethyl violet, crystal violet, azo type dyes, anthraquinone type dyes and cyanine type dyes. The amount of the dyes and pigments added is preferably about 0.5 to about 5% by mass of nonvolatile components in the entire composition.

(Other Additives)

Known additives such as inorganic fillers for improving the physical properties of the cured layer, as well as other plasticizers and sensitizers for improving inking properties on the surface of the photosensitive layer may also be added. The plasticizers include dioctyl phthalate, didodecyl phthalate, triethylene glycol dicaprylate, dimethyl glycol phthalate, tricresyl phosphate, dioctyl adipate, dibutyl sebacate, triacetyl glycerin, etc., and these can be added in an amount of 10% by mass or less relative to the total weight of the binder polymer and the addition-polymerizable compound. UV initiators and heat-crosslinking agents for enhancing the effect of heating and irradiation after development can also be added for the purpose of improving the layer strength (printing durability) described later.

When the photosensitive layer is arranged by coating, the photopolymerizable composition of the photosensitive layer components is dissolved in various organic solvents and applied onto the intermediate layer. The solvent used includes acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. These solvents can be used singly or in combination. The solid content of the coating solution is suitably 2 to 50% by mass.

The coating amount of the photosensitive layer mainly affects the sensitivity and developability of the photosensitive layer and the strength and printing durability of the layer exposed to light, and is desirably selected depending on the use. When the coating amount is too low, the printing durability is not sufficient. It is not preferable for the coating amount to be too high because sensitivity is reduced, light exposure requires more time, and a longer time is necessary for development processing. The coating amount on the planographic printing plate precursor for scanning light exposure as the major object of the invention is preferably in the range of about 0.1 to 10 $g/m^2$, and more preferably 0.5 to 5 $g/m^2$, in terms of dried weight.

[Substrate]

The substrate used in the invention is preferably a dimensionally stable plate, and examples thereof include paper, paper laminated with plastics (e.g., polyethylene, polypropylene, polystyrene, etc.), a metal plate (e.g., aluminum, zinc, copper, etc.) and plastic film (e.g., cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal, etc.), and papers or plastic films having these metals laminated or vapor-deposited thereon.

Particularly, the substrate is preferably a polyester film or an aluminum plate, the aluminum plate being particularly preferable in that it possesses excellent dimensional stability and is relatively inexpensive. Particularly preferable aluminum plates include a pure aluminum plate, or a mainly aluminum plate, an alloy plate based on aluminum containing a trace amount of different elements, or a plastic film having aluminum laminated or vapor-deposited thereon.

The different elements contained in the aluminum alloy include silicon, iron, manganese, copper, magnesium, chromium, zinc, bismuth, nickel, titanium, etc. The content of the different elements in the alloy is up to 10% by mass in total. Accordingly, pure aluminum is preferably used, but because production of absolutely pure aluminum is difficult in refining techniques, the aluminum may contain a trace amount of different elements. The composition of the aluminum plate thus used in the invention is not limited, and any aluminum plates made of a known and conventionally used aluminum material can be used, if necessary.

The thickness of the aluminum plate used as the substrate is preferably 0.1 to 0.6 mm, more preferably 0.15 to 0.4 mm, and most preferably 0.2 to 0.3 mm.

The aluminum plate is preferably used after the surface is roughened. Before the surface is roughened, degreasing treatment with a surfactant, an organic solvent or an aqueous alkali solution or the like is conducted as necessary in order to remove rolling oil from the surface.

The treatment of roughening the surface of the aluminum plate is conducted by a method selected from various methods such as mechanical surface roughening, surface roughening by electrochemical dissolution of the surface, and chemically and selectively dissolving the surface. The mechanical method can make use of known techniques such as ball grinding, brush grinding, blast grinding and buff grinding. An example of the electrochemical roughening method includes a method of roughening the surface by applying alternating current or direct current to a plate in an electrolytic solution containing hydrochloric acid or nitric acid. Further, a combination of both methods can also be utilized, as disclosed in JP-A No. 54-63902.

After the aluminum plate thus surface-roughened is subjected as necessary to alkali etching treatment and neutralization treatment, the plate can be subjected to anodizing treatment in order to improve the water holding property and abrasion resistance of the surface. The electrolyte for use in the anodizing treatment of the aluminum plate can be selected from various electrolytes for forming a porous oxide film, and generally sulfuric acid, phosphoric acid, oxalic acid, chromic acid or a mixed acid thereof is used. The concentration of the electrolyte is determined suitably depending on the type of the electrolyte.

The conditions for the anodizing treatment are varied depending on the electrolyte used and cannot be generalized, but it is usually preferable that the concentration of the electrolyte is 1 to 80% by mass, the liquid temperature is 5° to 70° C., the current density is 5 to 60 A/dm$^2$, the voltage is 1 to 100 V, and the electrolysis time is 10 seconds to 5 minutes. The amount of the anodized film is preferably not less than 1.0 g/m$^2$. If the amount of the anodized film is less than 1.0 g/m$^2$, sufficient layer strength cannot be obtained, the non-image area is easily scratched, and particularly, the planographic printing plate precursor exhibits so-called "tinting due to scratch" which is caused by ink adhesion to scratched regions at the time of printing.

After the anodizing treatment is finished, the surface of the aluminum plate is subjected to treatment for rendering it hydrophilic as necessary. Such hydrophilicity-providing treatment includes the alkali metal silicate (e.g., a sodium silicate aqueous solution) treatment method disclosed in U.S. Pat. Nos. 2,714,066, 3,181,461, 3,280,734 and 3,902,734. In this method, the aluminum plate is dipped in an aqueous solution of sodium silicate, or electrolyzed. Alternatively, a method of treatment with potassium fluorozirconate as disclosed in JP-B No. 36-22063 or a method of treatment with polyvinyl phosphonic acid as disclosed in U.S. Pat. Nos. 3,276,868, 4,153,461, and 4,689,272 is used.

[Undercoat Layer]

The planographic printing plate precursor used preferably in the invention can be prepared by applying the photosensitive layer coating solution onto a desired substrate to form a photosensitive layer (image forming layer), and before formation of the photosensitive layer, as necessary, an undercoat layer can also be formed on the substrate.

The component used in the undercoat layer include various organic compounds, for example, carboxymethyl cellulose, dextrin, gum arabic, amino-containing phosphonic acid such as 2-aminoethylphosphonic acid; organic phosphonic acid such as optionally substituted phenylphosphonic acid, naphthylphosphonic acid, alkylphosphonic acid, glycerophosphonic acid, methylene diphosphonic acid and ethylene diphosphonic acid; organic phosphoric acid such as optionally substituted phenylphosphoric acid, naphthylphosphoric acid, alkylphosphoric acid and glycerophosphoric acid; organic phosphinic acid such as optionally substituted phenylphosphinic acid, naphthylphosphinic acid, alkylphosphinic acid and glycerophosphinic acid; amino acids such as glycine and β-alanine; and hydroxyl-containing amine hydrochloride such as triethanolamine hydrochloride. The organic compounds can be used alone or as a mixture of two or more. In a preferable embodiment, the diazonium salt is undercoated as described above.

The amount of the undercoat layer applied is preferably 2 to 200 mg/m$^2$, and more preferably 5 to 100 mg/m$^2$. When the application amount is less than 2 mg/m$^2$, sufficient coating properties may not be achieved. On the other hand, when the amount is higher than 200 mg/m$^2$, no further effect can be achieved.

The undercoat layer can be provided by providing an undercoat layer by applying an undercoat layer coating solution containing the organic compound dissolved in water or an organic solvent such as methanol, ethanol and methyl ethyl ketone or a mixed solvent thereof, onto a substrate such as an aluminum plate, and then drying the solution; another method involves providing an undercoat layer by dipping a substrate such as an aluminum plate in an undercoat layer coating solution containing the organic compound dissolved in water or an organic solvent such as methanol, ethanol and methyl ethyl ketone or a mixed solvent thereof, to adsorb the organic compound onto the substrate, then washing and drying the substrate.

In the former method, the undercoat layer coating solution containing an organic compound at a concentration of 0.005 to 10% by mass is preferably used. In the latter method, the concentration of the organic compound in the undercoat layer coating solution is preferably 0.01 to 20% by mass, and more preferably 0.05 to 5% by mass. The dipping temperature is preferably 20° to 90° C., and more preferably 25° to 50° C. The dipping time is preferably 0.1 to 20 minutes, and more preferably 2 seconds to 1 minute.

The pH value of the undercoat layer coating solution can also be controlled in the range of 1 to 12 by the use of a basic material such as ammonia, triethylamine and potassium hydroxide or an acidic material such as hydrochloric acid and phosphoric acid. In preparation of the planographic printing plate precursor of the present invention, a yellow dye can also be added for the purpose of improving tone reproduction.

[Intermediate Layer]

For the purpose of preventing tinting and improving adhesiveness between the photosensitive layer and the substrate, an intermediate layer may be arranged in the planographic printing plate precursor in the present invention. Examples of such intermediate layers include those described in JP-B No. 50-7481, JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682, 11-84674, Japanese Patent Application Laid-Open (JP-A) Nos. 10-069092, 10-115931, 11-038635, 11-034634, 10-282465, 10-301262, 11-024277, 11-109641, 10-319600, 11-084674, 11-327152, 2000-010292, 2000-235254, 2000-352824, and 2001-209170.

[Protective Layer]

In the image forming material of the invention, a protective layer is preferably arranged on the photosensitive layer. The protective layer is arranged basically for protecting the photosensitive layer, and not only acts as an oxygen-impermeable layer when the photosensitive layer has an image forming mechanism in the radical polymerization system in the invention, but also serves as an ablation-preventing layer when exposed to the light of a high-intensity infrared laser.

The desired characteristics of the protective layer are that the protective layer does not substantially inhibit transmission of light used in light exposure, is excellent in adhesion to the photosensitive layer, and can be removed easily in the development step after exposure to light. The protective layer has been devised and is described in detail in U.S. Pat. No. 3,458,311 and JP-A No. 55-49729.

The materials usable in the protective layer are preferably water-soluble polymers possessing relatively excellent crystallinity, and examples thereof include water-soluble polymers such as polyvinyl alcohol, vinyl alcohol/vinyl phthalate copolymers, vinyl acetate/vinyl alcohol/vinyl phthalate copolymers, vinyl acetate/crotonic acid copolymers, polyvinyl pyrrolidone, acidic celluloses, gelatin, gum arabic, polyacrylic acid and polyacrylamide, and these can be used alone or in admixture. Among these compounds, polyvinyl alcohol can be used as a major component to give the best result to basic characteristics such as oxygen impermeability and removability by development.

The polyvinyl alcohol (PVA) used in the protective layer may be partially replaced by ester, ether and acetal insofar as it has unsubstituted vinyl alcohol units for giving necessary oxygen impermeability and water solubility. Similarly, it may partially have other copolymerizable components.

Examples of the polyvinyl alcohol include those hydrolyzed at a degree of 71 to 100%, having 300 to 2400 repeating units. Specific examples include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, etc. which are available from Kuraray Co., Ltd.

The components (PVA selected and additives used) in the protective layer, the coating amount, etc. are selected in consideration of properties such as fogging, adhesiveness and scratch resistance, in addition to oxygen impermeability and removability by development. In general, as the degree of hydrolysis of PVA used becomes higher (or the content of unsubstituted vinyl alcohol units in the protective layer becomes higher) or as the thickness of the layer is increased, higher oxygen impermeability occurs, which is advantageous in terms of sensitivity. However, if the oxygen impermeability becomes extremely high, an undesired polymerization reaction may occur during production or storage, or unnecessary fogging and dot gain may be generated upon exposure of an image to light.

Accordingly, the oxygen permeability (A) at 25° C. at 1 atmospheric pressure is preferably $0.2 \leqq A \leqq 20$ (cc/m$^2$·day).

The molecular weight of the (co)polymer such as polyvinyl alcohol is in the range of 2000 to 10,000,000, and preferably 20,000 to 3,000,000.

As other components in the protective layer, glycerin, dipropylene glycol, etc. can be added in an amount of a few percent by mass based on the polymer, in order to provide flexibility, and anionic surfactants such as sodium alkylsulfate and sodium alkylsulfonate, amphoteric surfactants such as alkylaminocarboxylates and alkylaminodicarboxylates and nonionic surfactants such as polyoxyethylene alkyl phenyl ether can be added in an amount of a few % by mass based on the (co)polymer.

The thickness of the protective layer is suitably 0.5 to 5 μm, and particularly preferably 0.5 to 2 μm.

In addition, the adhesion of the protective layer to an image area and the anti-scratch property thereof are very important for handling of the plate. That is, if a hydrophilic layer containing a water-soluble polymer is laminated on a lipophilic polymer layer, layer separation takes place easily due to insufficient adhesiveness, and the released portion causes deficiencies such as insufficient layer curing attributable to polymerization inhibition by oxygen. In order to cope with this problem, various proposals for improving the adhesiveness between the two layers have been made. For example, U.S. patent application Nos. 292,501 and 44,563 describe that an acrylic emulsion, a water-insoluble vinyl pyrrolidone-vinyl acetate copolymer, etc. are mixed in an amount of 20 to 60% by mass in a hydrophilic polymer based on polyvinyl alcohol and then laminated on a polymer layer, thereby achieving satisfactory adhesiveness. Any of these known techniques can be applied to the protective layer in the invention. The method of applying the protective layer is described in detail, for example, in U.S. Pat. No. 3,458,311 and JP-A No. 55-49729.

EXAMPLES

Hereinafter, the invention will be described with reference to the following examples, but the present invention is not limited thereto.

Examples 1 to 7, Comparative Examples 1 to 10

[Preparation of a Substrate]

<Aluminum Plate>

An aluminum alloy containing 0.06% by mass Si, 0.30% by mass Fe, 0.001% by mass Cu, 0.001% by mass Mn, 0.001% by mass Mg, 0.001% by mass Zn and 0.03% by mass Ti, the balance being Al and inevitable impurities, was used to prepare a melt, then subjected to a molten metal treatment, filtered and formed into an ingot of 500 mm in thickness and 1200 mm in width with a DC casting method. After its surface layer of 10 mm in average thickness was shaved with a surface shaving machine, the ingot was kept at 550° C. for about 5 hours, and when the temperature was reduced to 400° C., the ingot was formed into a rolled plate of 2.7 mm in thickness with a hot rolling mill. Then, the plate was subjected to heat treatment at 500° C. with a continuous annealing device and finished in cold rolling to give the plate a thickness of 0.24 mm as an aluminum plate of JIS 1050 material. This aluminum plate was formed into a plate of 1030 mm in width and then subjected to the following surface treatment.

<Surface Treatment>

In the surface treatment, the following treatments (a) to (j) were successively conducted. After each treatment and water washing, all remaining liquid was removed with nip rollers.

(a) Mechanical Surface Roughening Treatment

Using the device shown in FIG. 1, the surface of the aluminum plate was subjected to mechanical surface roughening treatment with a rotating roller-shaped nylon brush while being supplied with an aqueous suspension of an abrasive having a specific gravity of 1.12 (Pamis) as an abrasive slurry. In FIG. 1, 1 is the aluminum plate, 2 and 4 are roller-shaped brushes, 3 is the abrasive slurry, and 5, 6, 7 and 8 are supporting rollers. The average particle diameter of the abrasive was 30 μm, and the maximum particle diameter was 100 μm. The nylon brush was made of 6·10 nylon, the length of the brush bristle was 45 mm, and the diameter of the brush bristle was 0.3 mm. The nylon brush had bristles arranged densely in holes in a stainless steel cylinder of φ300 mm. Three rotating brushes were used. The distance between the two supporting rollers (φ200 nm) under the brushes was 300 mm. The brush roller was pressed against the aluminum plate until the loading of a driving motor for rotating the brush was increased to 7 kW plus relative to the loading before the brush roller was pressed against the aluminum plate. The direction of rotation of the brush was the same as the transporting direction of the aluminum plate. The number of revolutions of the brush was 200 rpm.

(b) Alkali Etching Treatment

The aluminum plate obtained above was subjected to etching treatment by spraying with an aqueous solution of sodium hydroxide at a concentration of 2.6% by mass and aluminum ion at a concentration of 6.5% by mass at a temperature of 70° C., whereby the aluminum plate was dissolved in an amount of 10 g/m$^2$. Thereafter, the aluminum plate was washed by spraying with water.

(c) Desmut Treatment

The aluminum plate was subjected to desmut treatment with an aqueous solution (containing 0.5% by mass aluminum ion) of 1% by mass nitric acid at a temperature of 30° C. and then washed by spraying with water. The aqueous solution of nitric acid used in desmut treatment was a waste liquid in the step of electrochemical surface roughening treatment with an alternating current in an aqueous solution of nitric acid.

(d) Electrochemical Surface Roughening Treatment

Figure 2:
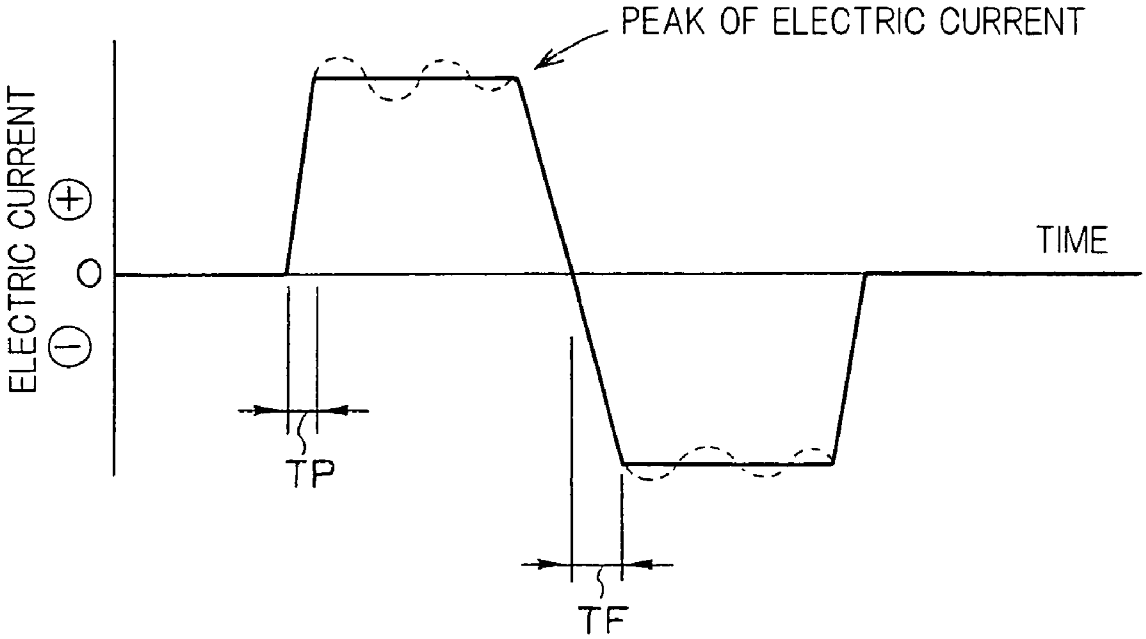
FIG. 2 is a graph showing one example of an alternating waveform electric current waveform used in electrochemical surface roughening treatment in preparation of the planographic printing substrate in the invention.
Figure 3:
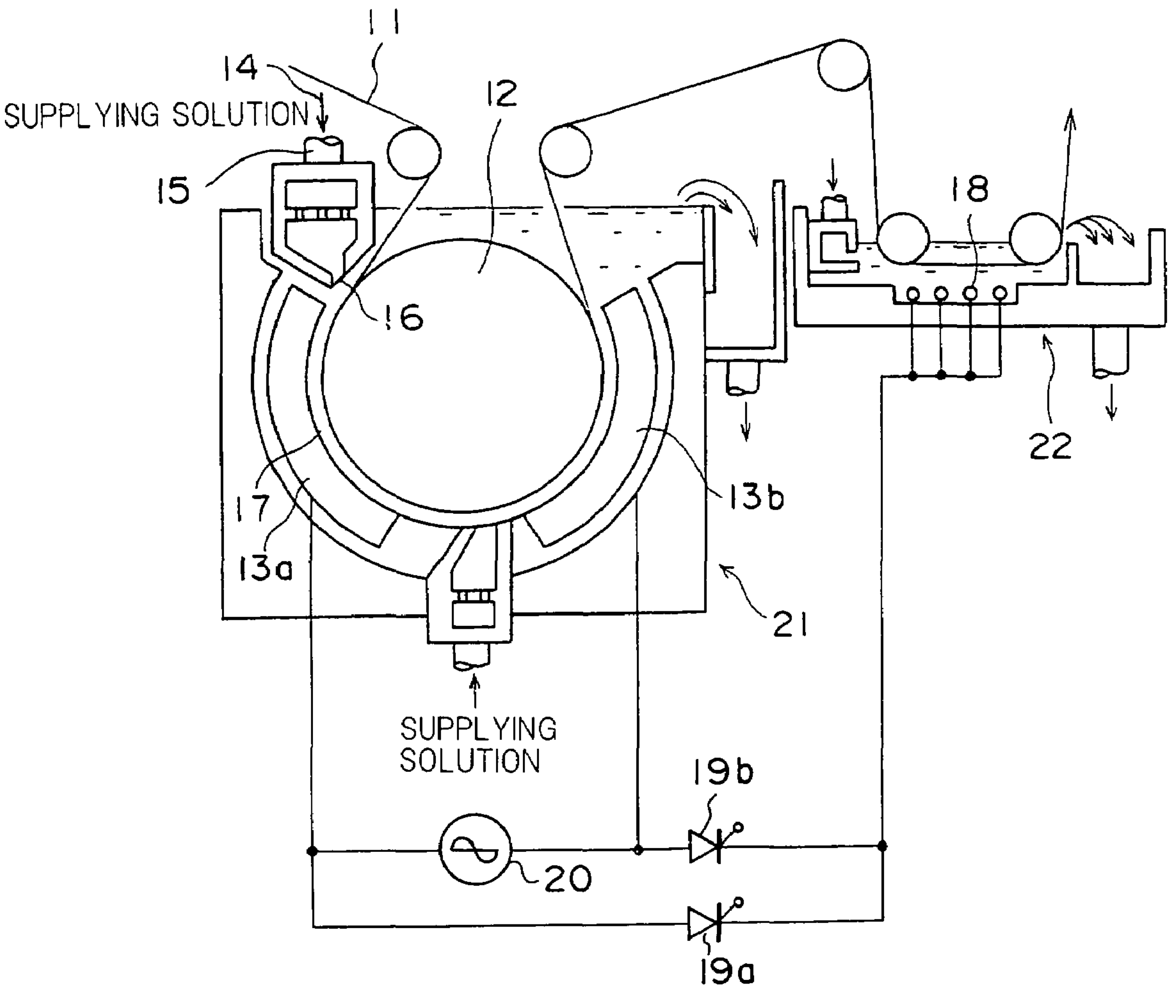
FIG. 3 is a side view showing one example of a radial cell in electrochemical surface roughening treatment using an alternating current in preparation of the planographic printing substrate in the invention.

The plate was continuously subjected to electrochemical surface roughening treatment with an alternating voltage of 60 Hz. The electrolytic solution used was 10.5 g/L aqueous nitric acid solution (containing 5 g/L aluminum ion and 0.007% by mass ammonium ion) at a temperature of 50° C. The alternating current power source waveform is shown in FIG. 2, and the electrochemical surface roughening treatment was carried out with a carbon electrode as a counter electrode, wherein the time TP required for the electric current to reach from 0 to the peak was 0.8 msec., the duty ratio was 1:1 and a trapezoid rectangular wave alternating current was used. Ferrite was used as an auxiliary anode. The electrolytic bath used is shown in FIG. 3. In FIG. 3, Numeral 11 denotes an aluminum plate, 12 denotes a radial drum roller, 13*a* and 13*b* denote main electrodes, 14 denotes an electrolytic solution, 15 denotes an electrolytic solution supplying inlet, 16 denotes a slit, 17 denotes an electrolytic solution passage, 18 denotes an auxiliary anode, 19*a* and 19*b* denote thyristors, 20 denotes an alternate power source, 20 denotes a main electrolytic bath, and 21 denotes an auxiliary anode bath.

The current density was 30 A/dm$^2$ in terms of the electric current peak, and the electrical quantity was 220 C/dm$^2$ in terms of the total electrical quantity upon anodizing of the aluminum plate. An effective shunt current of 5% of the electric current from the power source was fed to the auxiliary anode. Thereafter, the plate was washed by spraying with water.

(e) Alkali Etching Treatment

The aluminum plate was subjected to etching treatment by spraying with an aqueous solution of sodium hydroxide at a concentration of 26% by mass and aluminum ion at a concentration of 6.5% by mass at a temperature of 32° C., whereby the aluminum plate was dissolved in an amount of 0.50 g/m$^2$, and smut components based on aluminum hydroxide formed by the electrochemical surface roughening treatment using the alternating current in the previous stage were removed, and the edge of the formed pit was dissolved to smooth the edge. Thereafter, washing by spraying with water was carried out.

(f) Desmut Treatment

The aluminum plate was subjected to desmut treatment with an aqueous solution (containing 4.5% by mass aluminum ion) of 15% by mass nitric acid at a temperature of 30° C. and then washed by spraying with water. The aqueous solution of nitric acid used in desmut treatment was waste liquid in the step of electrochemical surface roughening treatment with an alternating current in an aqueous solution of nitric acid.

(g) Electrochemical Surface Roughening Treatment

The plate was subjected continuously to electrochemical surface roughening treatment with an alternating voltage of 60 Hz. The electrolyte used was 5.0 g/L aqueous hydrochloric acid solution (containing 5 g/L aluminum ion) at a temperature of 35° C. The alternating current power source waveform is shown in FIG. 2, and the electrochemical surface roughening treatment was carried out with a carbon electrode as a counter electrode, wherein the time TP required for the electric current to reach from 0 to the peak was 0.8 msec., the duty ratio was 1:1 and a trapezoid rectangular wave alternating current was used. Ferrite was used as an auxiliary anode. The electrolytic bath used is shown in FIG. 3.

The current density was 25 A/dm$^2$ in terms of the electric current peak, and the electrical quantity was 50 C/dm$^2$ in terms of the total electrical quantity upon anodizing of the aluminum plate. Thereafter, the plate was washed by spraying with water.

(h) Alkali Etching Treatment

The aluminum plate was subjected to etching treatment by spraying with an aqueous solution of sodium hydroxide at a concentration of 26% by mass and aluminum ion at a concentration of 6.5% by mass at a temperature of 32° C., whereby the aluminum plate was dissolved in an amount of 0.10 g/m$^2$, and smut components based on aluminum hydroxide formed by the electrochemical surface roughening treatment using the alternating current in the previous stage were removed, and the edge of the formed pit was dissolved to smooth the edge. Thereafter, washing by spraying with water was carried out.

(i) Desmut Treatment

The aluminum plate was subjected to desmut treatment with an aqueous solution (containing 0.5% by mass aluminum ion) of 25% by mass sulfuric acid at a temperature of 60° C. and then washed by spraying with water.

(j) Anodizing Treatment

Figure 4:
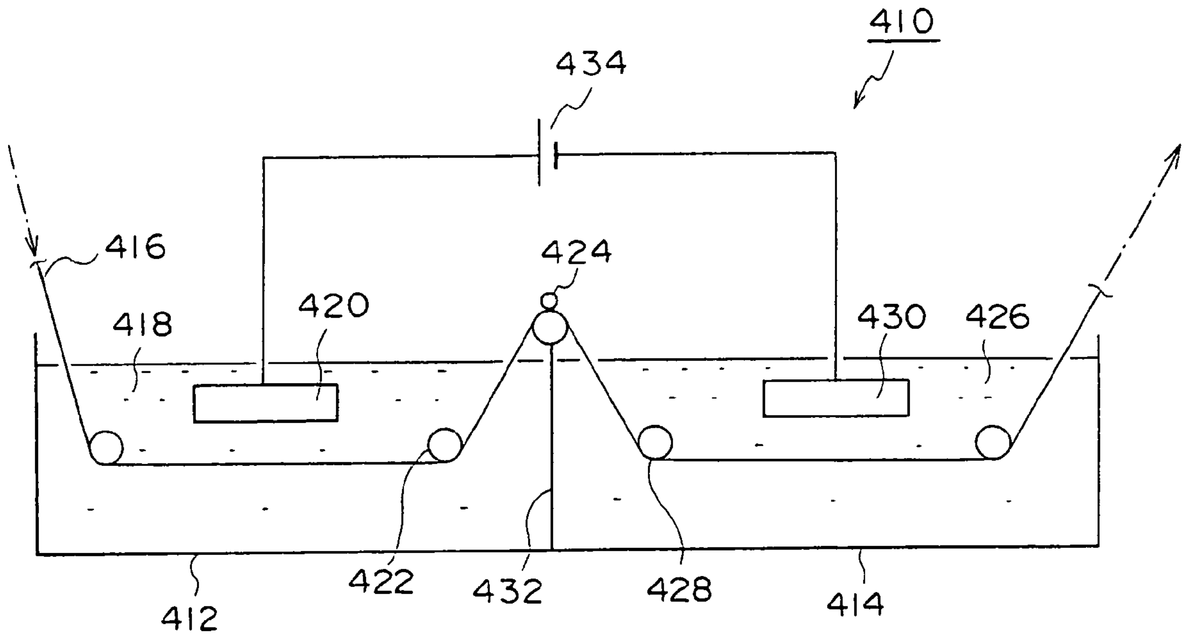
FIG. 4 is a schematic drawing of an anodizing device used in anodizing treatment in preparation of the planographic printing substrate in the invention.

Anodizing treatment was carried out with an anodizing device having the structure shown in FIG. 4 to provide a substrate for planographic printing. In FIG. 4, Numeral 410 denotes an anodizing treatment device, 412 denotes a power supplying bath, 414 denotes an electrolytic bath, 416 denotes an aluminum plate, 418 and 426 denotes electrolytic solutions, 420 denotes a power supplying electrode, 422 and 428 denote rollers, 424 denotes nip rollers, 430 denotes an electrolytic electrode, 432 denotes a bath wall, and 434 denotes a direct current power source.

The electrolytic solution supplied to the first and second electrolytic zones were sulfuric acid solution. Both the electrolytes were 170 g/L sulfuric acid (containing 0.5% by mass aluminum ion) at a temperature of 38° C. Thereafter, washing by spraying with water was carried out. The final anodized coating was 2.7 g/m$^2$.

[Undercoat]

Next, an undercoat solution shown below was applied by use of a wire bar onto the aluminum substrate and dried at 90° C. for 30 seconds in a hot-air drying oven. The amount of the coating after drying was 10 mg/m$^2$.

| <Undercoat solution> | |
|---|---|
| Ethyl acrylate/sodium 2-acrylamide-2-methyl-1-propanesulfonate copolymer (molar ratio 75:15) | 0.1 g |
| 2-Aminoethylphosphonic acid | 0.1 g |
| Methanol | 50 g |
| Deionized water | 50 g |

[Photosensitive Layer]

Next, the photosensitive layer coating solution [P-1] below was prepared and applied by the use of a wire bar onto the aluminum substrate which had been coated with the undercoat described above. The solution was dried at 125° C. for 27 seconds in a hot-air drying oven to form a planographic printing plate precursor. The coating amount after drying was in the range of 1.2 to 1.3 g/$m^2$.

| <Photosensitive layer coating solution [P-1]> | |
|---|---|
| Infrared absorbing agent (IR-1) | 0.08 g |
| Polymerization initiator (OS-1) | 0.25 g |
| Additive (PM-1) | 0.1 g |
| Dipentaerythritol hexaacrylate | 1.00 g |
| Binder (BT-1) | 1.00 g |
| Ethyl Violet chloride | 0.04 g |
| Fluorine type surfactant (W-1) | 0.03 g |
| Stearoyl methyl amide | 0.06 g |
| Methyl ethyl ketone | 14 g |
| Methanol | 6.5 g |
| 1-Methoxy-2-propanol | 14 g |

The structures of the infrared absorbing agent (IR-1), the polymerization initiator (OS-1), the additive (PM-1), the binder (BT-1) and the fluorine type surfactant (W-1) used in the photosensitive layer coating solution are shown below:

Infrared absorbing agent (IR-1)

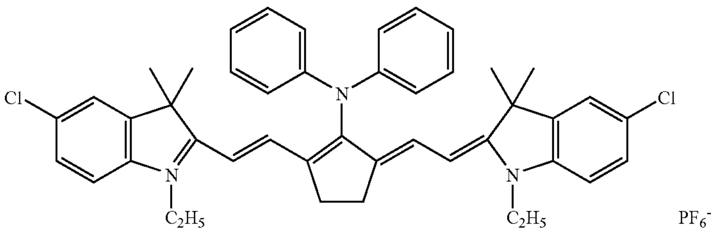

Binder (BT-1)

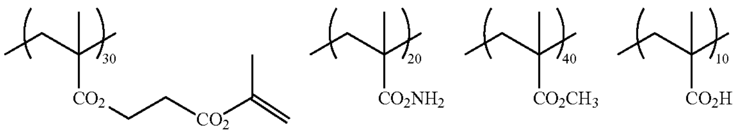

Fluorine type surfaetant (W-1)

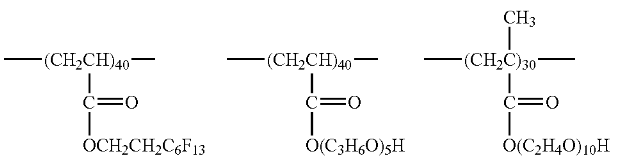

Polymerization initiator (OS-1)

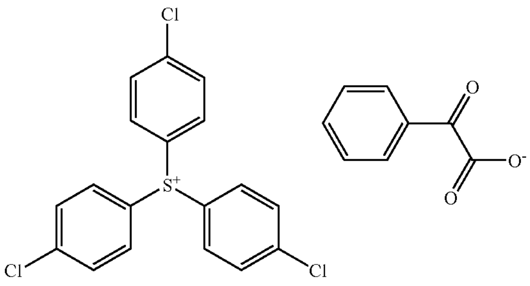

Additives (PM-1)

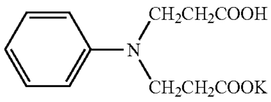

[Protective Layer (Overcoat Layer)]

An aqueous solution of 3% by mass polyvinyl alcohol (the degree of saponification of 98% by mole, the degree of polymerization of 500) was applied by the use of a wire bar onto the surface of the photosensitive layer and dried at 100° C. for 90 seconds in a hot-air drying oven. The coating amount after drying was 1.0 g/m$^2$. The coefficient of dynamic friction thereof against a sapphire needle (R: 1 mm) was 0.35.

[Plate-making Process]

<Light Exposure Step>

The resultant negative type planographic printing plate precursor was exposed with 85% screen tint image to light by the use of a 32-channel outer drum laser beam exposing device equipped with a water-cooling 40-W infrared semiconductor laser element in an output wavelength of 820 nm, under the beam diameter (full-width half-maximum (FWHM)) and overlapping coefficient shown in Table 1. The energy of exposure light on the plate was 100 mJ/cm$^2$.

<Development Step>

After the light exposure, the image was developed in an automatic developing machine IP85HD manufactured by G&J, at a transporting speed (line speed) of 1.35 m/min. at a development temperature of 25° C. without operating its preheating section. DV-2 (Trade name, manufactured by Fuji Photo Film Co., Ltd.) diluted with water at a ratio of 1:4 was used as the developing solution, and FP-2W (Trade name, manufactured by Fuji Photo Film Co., Ltd.) diluted with water at a ratio of 1:1 was used as the finisher.

[Evaluation of the Planographic Printing Plate]

(1) Evaluation of Image Qualities

The image deficiency and screen tint unevenness of the planographic printing plate obtained by the plate making process described above were evaluated with the naked eye. Visual evaluation at a level of 1 to 5 was conducted wherein 3 was a practically usable lower limit, and 2 or less was a practically unusable level.

(2) Printing Performance

The obtained planographic printing plate was subjected to printing with a printing machine Lithron (Trade name) manufactured by Komori Corporation, and its printing durability was evaluated in terms of the number of obtainable excellent prints.

The results are shown in Table 1.

(3) Environmental temperature and humidity dependence

In the step of light exposing and development processing of 85% screen tint image, the image was formed under two environmental conditions; that is, one condition was ordinary temperature and ordinary humidity (25° C. and 50% RH) and the other condition was a high temperature and high humidity (30° C. and 75% RH). The dot percent on the plate was measured by a densitometer RD918 manufactured by Gretag Macbeth, and the difference between the dot percent under the condition of high temperature and high humidity and that under the condition of ordinary temperature and ordinary humidity was used as an indicator of environmental temperature and humidity dependence. A smaller difference was judged to be excellent with less environmental temperature and humidity dependence. A difference within 2% is practically not problematic, but a difference of higher than 2% is practically problematic and not preferable.

TABLE 1

| | Beam diameter (μm) | Overlapping coefficient | Screen tint unevenness | Printing durability (Number of prints) | Dependence on temperature and humidity |
|---|---|---|---|---|---|
| Example 1 | 20 | 1.2 | 4 | 100000 | ±0% |
| Example 2 | 20 | 1.6 | 5 | 100000 | ±0% |
| Example 3 | 20 | 0.8 | 4 | 100000 | ±0% |
| Comparative example 1 | 20 | 0.6 | 2 | 20000 | −3% |
| Example 4 | 10 | 0.8 | 4 | 100000 | ±0% |
| Comparative example 2 | 10 | 0.6 | 2 | 100000 | −3% |
| Comparative example 3 | 40 | 1.2 | 3 | 40000 | −3% |
| Comparative example 4 | 40 | 0.6 | 2 | 20000 | −6% |

As is evident from Table 1, it was found that in the image forming method in Examples 1 to 4, the images on the plate were free of environmental temperature and humidity dependence, and prints excellent in image-forming property without image unevenness, similar to prints obtained under the condition of ordinary temperature and ordinary humidity, were obtained under the condition of high temperature and high humidity, and the plate was excellent in printing durability. In Comparative Examples 1 and 2 wherein the infrared beam diameter was the same as in Examples 1 to 4 but the overlapping coefficient was too small, image unevenness was at a practical level or less, and the number of prints having excellent image quality was only 20,000. In Comparative Examples 3 and 4 wherein the infrared beam diameter was too high, image unevenness and printing durability were found to be practically problematic. In the Comparative Examples, the image-forming property was deteriorated under the condition of high temperature and high humidity, and the environmental temperature and humidity dependence was high. It was confirmed by comparing Comparative Example 3 with Example 1 that even if the good overlapping coefficient of the invention is satisfied, the effect of the invention cannot be achieved when the infrared beam diameter is outside of the range in the invention.

Example 5

The planographic printing plate precursor in Example 5 was obtained in the same manner as in Example 1 except that an ethylenically unsaturated bond-containing compound (M-1) below was used in place of dipentaerythritol hexaacrylate in the photosensitive layer coating solution [P-1], and a polyurethane-based binder (P-2) was used in place of the binder polymer (BT-1). The planographic printing plate precursor was evaluated in the same manner as in Example 1.

(M-1)

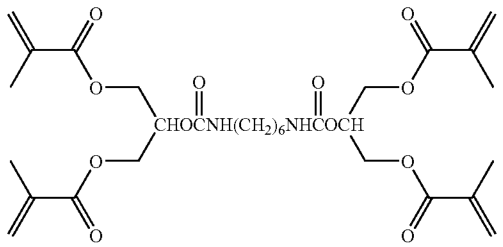

(P-2)

MDI/HMDI/PPG 1000/DMPA = 40/10/11/39 mol%

Mw ≈ 55000

MDI:

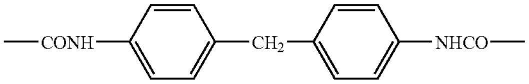

HMDI: $—CONH—(CH_2)_6—NHCO—$

PPG 1000 (Mw 1000):

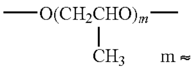

m ≈ 17

DMPA:

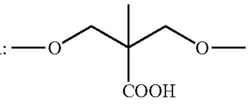

The evaluation results showed that the screen tint unevenness was 4 and the printing durability (number of prints) was 150,000, indicating excellent printing durability without image unevenness. The environmental temperature and humidity dependence was ±0%, i.e., at a level without problem. By using the urethane-based binder, an effect of further improving printing durability was observed.

According to the invention, there can be provided an image forming method capable of high-speed light exposure and excellent in image forming ability with improvements in humidity dependence at the time of light exposure. The image forming method is useful for making a planographic printing plate precursor excellent in productivity and printing durability.

What is claimed is:

1. An image forming method comprising:

scanning exposing an image forming material having a photosensitive layer comprising an infrared absorbing agent, a polymerization initiator and a polymerizable compound on a substrate to infrared beams from a light source so that the distance between centers of the infrared beams in the sub-scanning direction is smaller than the beam diameter of each of the infrared beams, the solubility of the photosensitive layer in an alkali developing solution being reduced upon exposure to light of wavelengths in the range of 750 nm to 1400 nm; and forming an image by developing the exposed image forming material, wherein the imagewise light exposure is carried out under conditions where the infrared beam diameter is 20 μm or less, and the overlapping coefficient, which is the ratio of the full-width half-maximum (FWHM) of the infrared beam diameter to the distance between beam centers in the sub-scanning direction, is in the range of 0.8 to 4.

2. An image forming method according to claim 1, wherein the image forming material is provided successively with the photosensitive layer and a protective layer on the substrate.

3. An image forming method according to claim 1, wherein the image forming material is provided with a photosensitive layer comprising an infrared absorbing agent, a polymerization initiator, a polymerizable compound and a binder polymer having a repeating unit represented by the following formula (I):

(I)

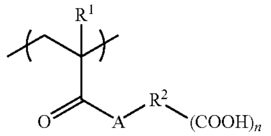

wherein $R^1$ represents a hydrogen atom or a methyl group; $R^2$ represents a linking group including two or more atoms selected from the group consisting of a carbon atom, a hydrogen atom, an oxygen atom, a nitrogen atom and a sulfur atom, the number of the atoms being 2 to 82; A represents an oxygen atom or $—NR^3—$, wherein $R^3$ represents a hydrogen atom or a monovalent hydrocarbon group having 1 to 10 carbon atoms; and n is an integer of 1 to 5.

4. An image forming method according to claim 3, wherein the image forming material is a photosensitive planographic printing plate precursor.

5. An image forming method according to claim 4, wherein the polymerization initiator is at least one compound selected from onium salts represented by formulae (III) to (V):

$Ar^{11}—I^+—Ar^{12}\ Z^{11-}$ General formula (III)

wherein $Ar^{11}$ and $Ar^2$ each independently represents an aryl group containing 20 or less carbon atoms, which may have a substituent group, and $Z^{11-}$ represents a counterion selected from the group consisting of a halogen ion, perchlorate ion, tetrafluoroborate ion, hexafluorophosphate ion, carboxylate ion and sulfonate ion;

$Ar^{21}—N^+{\equiv}N\ Z^{21-}$ General formula (IV)

wherein $Ar^{21}$ represents an aryl group containing 20 or less carbon atoms, which may have a substituent group, and $Z^{21-}$ represents a counterion having the same meaning as defined for $Z^{11-}$;

general formula (V)

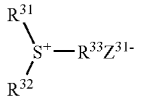

wherein $R^{31}$, $R^{32}$ and $R^{33}$ may be the same or different, and each represents a hydrocarbon group containing 20 or less carbon atoms, which may have a substituent group, and $Z^{31-}$ represents a counterion having the same meaning as defined for $Z^{11-}$.

6. An image forming method according to claim 5, which further comprises a heating step for heat treatment of the light-exposed photosensitive planographic printing plate precursor at a temperature in the range of 60° to 150° C. after the step of light exposure with an infrared beam and before the image forming step of developing the exposed photosensitive planographic printing plate precursor.

7. An image forming method according to claim 6, which further comprises desensitizing the photosensitive planographic printing plate precursor with a desensitizing solution after the image forming step by developing the photosensitive planographic printing plate precursor.

8. An image forming method comprising:

exposing imagewisely an image forming material having a photosensitive layer comprising an infrared absorbing agent, a polymerization initiator and a polymerizable compound on a substrate to infrared beams emitted from a laser diode light source so that the distance between centers of the infrared beams in the sub-scanning direction is smaller than the beam diameter of each of the infrared beams, the solubility of the photosensitive layer in an alkali developing solution being reduced upon exposure to light of wavelengths in the range of 750 nm to 1400 nm; and developing the image forming material, wherein the imagewise light exposure is carried out under conditions where the resolution of the infrared beam used in the light exposure step is 300 to 1300 dpi, the beam diameter is 20 μm or less, and the overlapping coefficient, which is the ratio of the full-width half-maximum (FWHM) of the infrared beam diameter to the distance between beam centers in the sub-scanning direction, is in the range of 0.8 to 4.

9. An image forming method according to claim 8, wherein the image forming material is provided successively with the photosensitive layer and a protective layer on the substrate.

10. An image forming method according to claim 9, wherein the image forming material is provided with a photosensitive layer comprising an infrared absorbing agent, a polymerization initiator, a polymerizable compound and a binder polymer having a repeating unit represented by formula (I):

(I)

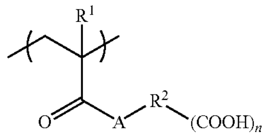

wherein $R^1$ represents a hydrogen atom or a methyl group; $R^2$ represents a linking group including two or more atoms selected from the group consisting of a carbon atom, a hydrogen atom, an oxygen atom, a nitrogen atom and a sulfur atom, the number of the atoms being 2 to 82; A represents an oxygen atom or $—NR^3—$, wherein $R^3$ represents a hydrogen atom or a monovalent hydrocarbon group having 1 to 10 carbon atoms; and n is an integer of 1 to 5.

11. An image forming method according to claim 10, wherein the image forming material is a photosensitive planographic printing plate precursor.

12. An image forming method according to claim 11, wherein the protective layer comprises at least one water-soluble polymer selected from the group consisting of polyvinyl alcohol, vinyl alcohol/vinyl phthalate copolymers, vinyl acetate/vinyl alcohol/vinyl phthalate copolymers, vinyl acetate/crotonic acid copolymers, polyvinyl pyrrolidone, acidic celluloses, gelatin, gum arabic, polyacrylic acid and polyacrylamide.

13. An image forming method according to claim 12, wherein the oxygen permeability (A) of the protective layer at 25° C. at 1 atmospheric pressure is represented by the formula $0.2 \leqq A \leqq 20$ (cc/m$^2$·day).

14. An image forming method according to claim 13, wherein the polymerization initiator is at least one compound selected from onium salts represented by formulae (III) to (V):

$$Ar^{11}—I^{+}—Ar^{12}\ Z^{11-}$$ General formula (III)

wherein $Ar^{11}$ and $Ar^{12}$ each independently represents an aryl group containing 20 or less carbon atoms, which may have a substituent group; and $Z^{11-}$ represents a counterion selected from the group consisting of a halogen ion, perchlorate ion, tetrafluoroborate ion, hexafluorophosphate ion, carboxylate ion and sulfonate ion;

$$Ar^{21}—N^{+}\equiv N\ Z^{21-}$$ General formula (IV)

wherein $Ar^{21}$ represents an aryl group containing 20 or less carbon atoms, which may have a substituent group; and $Z^{21-}$ represents a counterion having the same meaning as defined for $Z^{11-}$;

general formula (V)

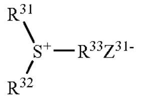

wherein $R^{31}$, $R^{32}$ and $R^{33}$ may be the same or different, and represent a hydrocarbon group containing 20 or less carbon atoms, which may have a substituent group; and $Z^{31-}$ represents a counterion having the same meaning as defined for $Z^{11-}$.

15. An image forming method according to claim 14, which further comprises a heating step for heat treatment of the light-exposed photosensitive planographic printing plate at a temperature in the range of 60° to 150° C. after the step of light exposure with infrared beams and before the image forming step of developing the photosensitive planographic printing plate.

16. An image forming method according to claim 15, which further comprises a step of desensitizing the photosensitive planographic printing plate with a desensitizing solution after the image forming step by developing the photosensitive planographic printing plate.

* * * * *